US007986192B2

(12) United States Patent
Lee et al.

(10) Patent No.: US 7,986,192 B2
(45) Date of Patent: Jul. 26, 2011

(54) HARMONIC REJECTION MIXER AND HARMONIC REJECTION MIXING METHOD

(75) Inventors: Sang-sung Lee, Daejeon (KR); Sang-gug Lee, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 30 days.

(21) Appl. No.: 12/639,601

(22) Filed: Dec. 16, 2009

(65) Prior Publication Data

US 2011/0006849 A1    Jan. 13, 2011

(30) Foreign Application Priority Data

Jul. 7, 2009    (KR) .................. 10-2009-0061724

(51) Int. Cl.
*H03B 21/00* (2006.01)
*H03B 21/01* (2006.01)
*H03B 27/00* (2006.01)
*H04B 1/26* (2006.01)
*H04B 1/28* (2006.01)

(52) U.S. Cl. ................ 331/37; 331/42; 331/43; 331/45; 331/46; 455/333

(58) Field of Classification Search ............... 331/37, 331/42, 43, 45, 46; 455/313, 333
See application file for complete search history.

(56) References Cited

U.S. PATENT DOCUMENTS 7,260,360 B2 * 8/2007 Seo et al. .............. 455/41.2
7,483,683 B1   1/2009 Wong et al.
7,535,277 B2 * 5/2009 Suzuki ................. 327/254

FOREIGN PATENT DOCUMENTS

KR   10-2008-0077663 A    8/2008
KR   10-2009-0023702 A    3/2009

* cited by examiner

*Primary Examiner* — David Mis
(74) *Attorney, Agent, or Firm* — Sughrue Mion, PLLC

(57) ABSTRACT

Provided are a harmonic rejection mixer and a harmonic rejection mixing method. A plurality of oscillator signals having a ⅓ duty cycle and uniform phase differences may be generated and a differential or quadrature mixer with harmonic rejection may be realized by using the oscillator signals.

30 Claims, 20 Drawing Sheets

FIG. 1
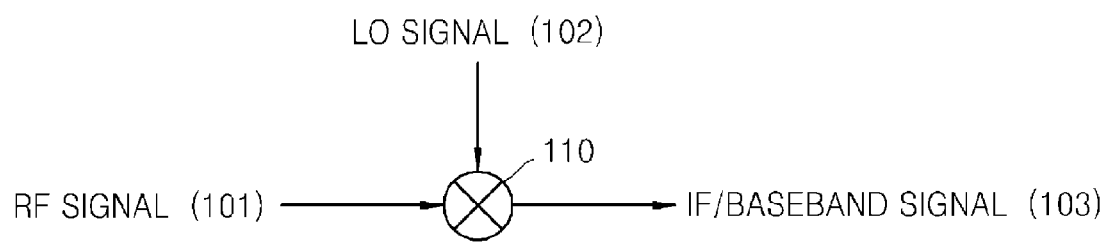
FIG. 2
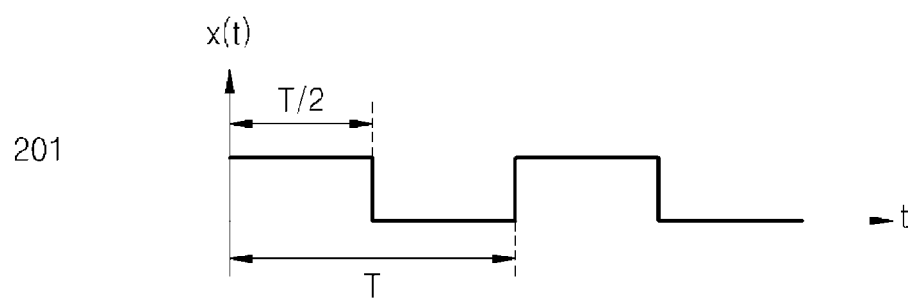
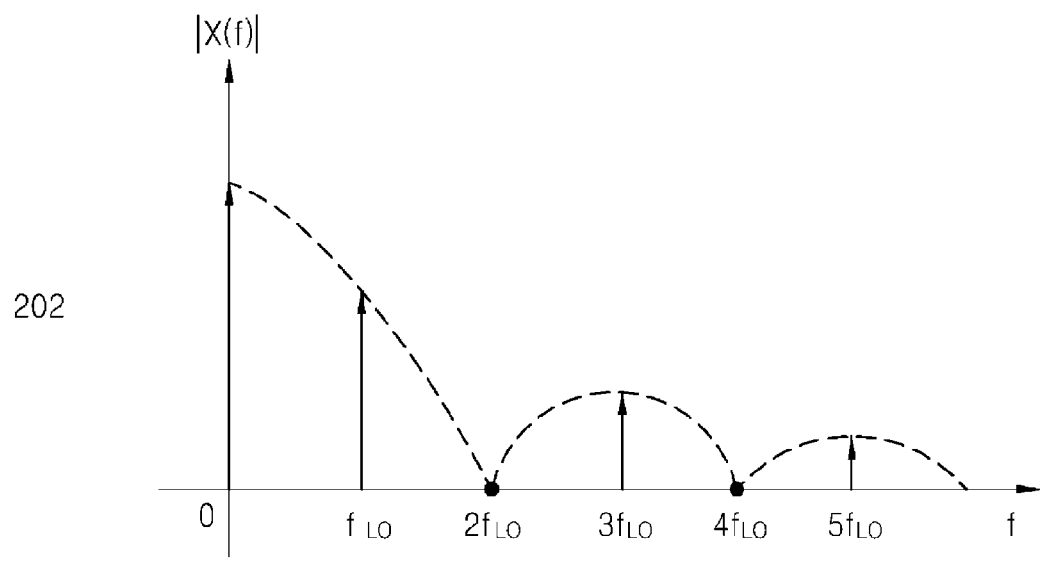

FIG. 3
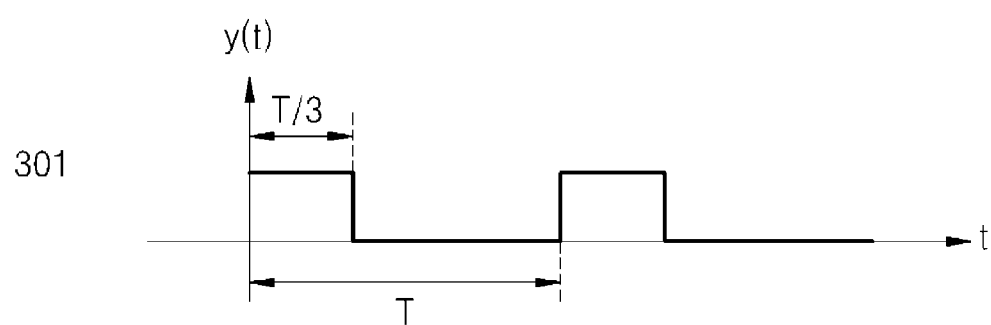
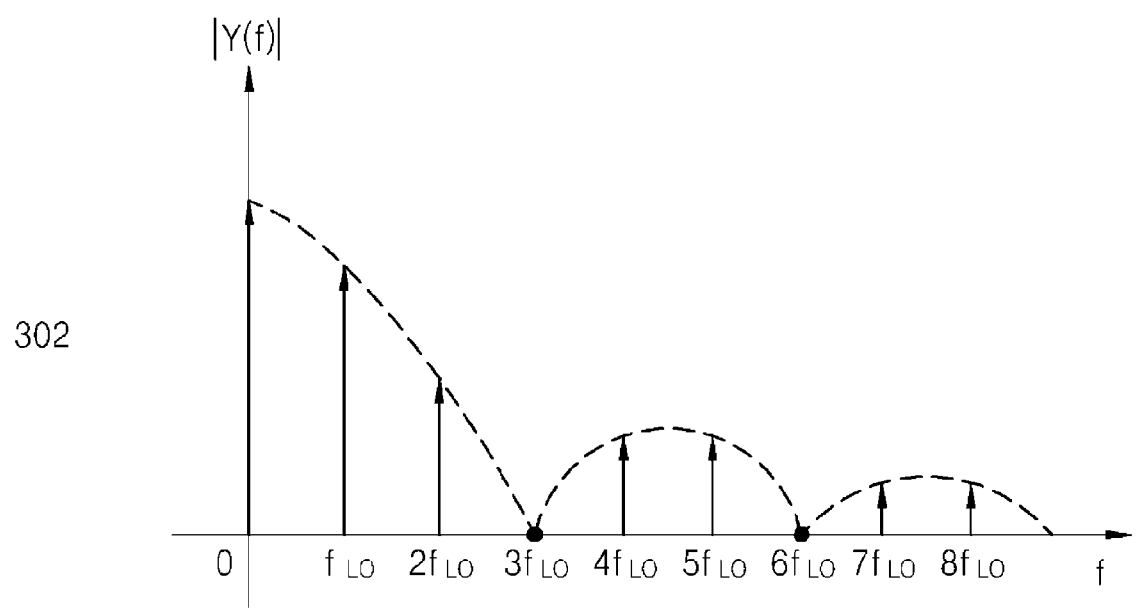

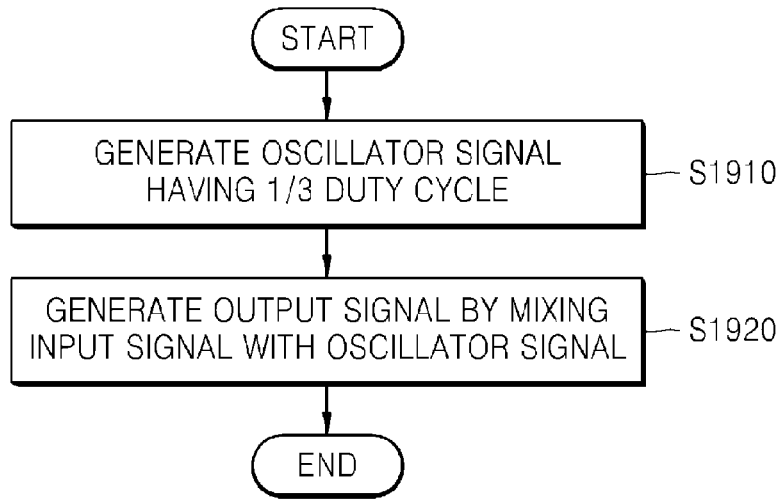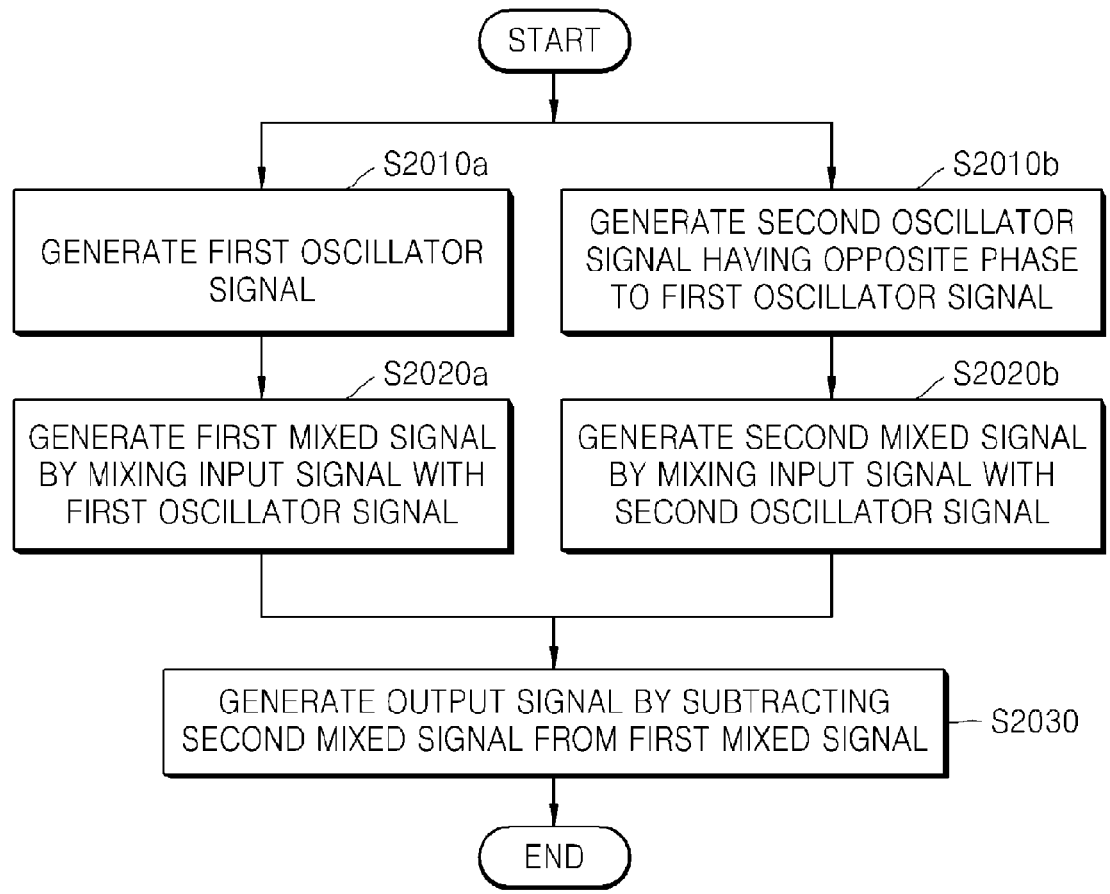

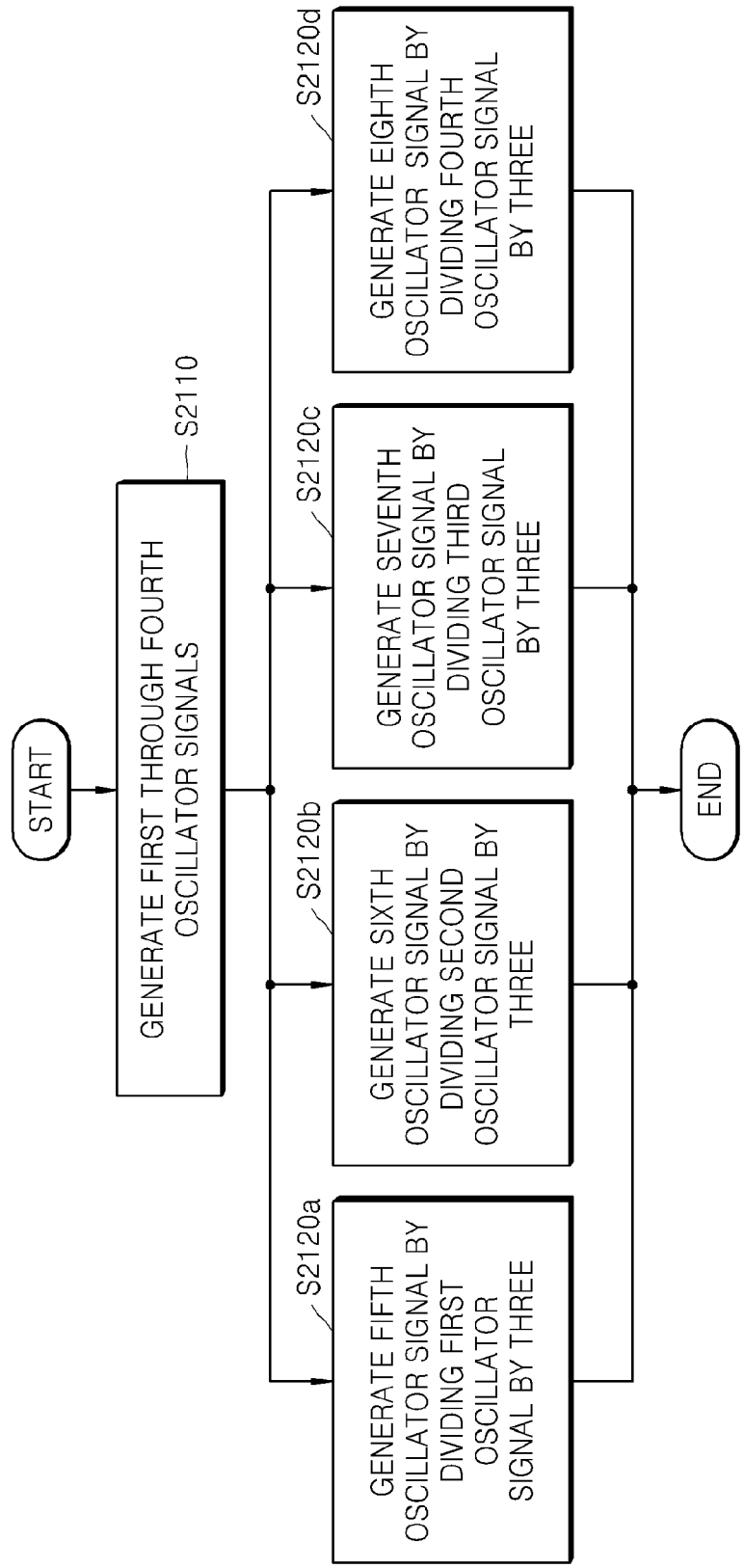

HARMONIC REJECTION MIXER AND HARMONIC REJECTION MIXING METHOD

CROSS-REFERENCE TO RELATED PATENT APPLICATION

This application claims priority from Korean Patent Application No. 10-2009-0061724, filed on Jul. 7, 2009, in the Korean Intellectual Property Office, the disclosure of which is incorporated herein in its entirety by reference.

BACKGROUND OF THE INVENTION

1. Field of the Invention

Exemplary embodiments of the present invention relate to a harmonic rejection mixer and a harmonic rejection mixing method, and more particularly, to a mixing method and apparatus for generating a plurality of oscillator signals having ⅓ duty cycles and uniform phase differences and rejecting harmonics by using the oscillator signals.

2. Description of the Related Art

As signals of undesired channels are input to a receiver of a broadband wireless communication system, and more particularly, a wireless broadcasting communication system such as an Advanced Television Systems Committee (ATSC) system, these signals may be combined with harmonics of a local oscillator (LO) of the receiver and added to a desired channel during a frequency mixing process. The added signals may act as noise and may reduce a signal-to-noise ratio (SNR) of the receiver.

Methods of reducing harmonic mixing in a broadband receiver may include a method using a radio frequency (RF) filter and a method using a frequency mixer. The RF filter method may simply reject harmonics by using only one filter but may have to use an external element to obtain a desired level of harmonic rejection in consideration of the performance of a system. Meanwhile, the frequency mixer method may combine multi-phase LO signals with an input signal by using a plurality of parallel frequency mixers and may remove an effect due to harmonic mixing by adjusting gains of combined signals. Although this method may realize an on-chip device, LO signals having uniform phase differences may not be easily formed over a broadband and harmonic rejection may be reduced due to mismatches between parallel circuits. A method of dividing a high frequency LO signal may be used to form uniform phase differences over a broadband. However, this method may have a high structural complexity and may increase power consumption.

Accordingly, a frequency mixer rejecting harmonics, with low power consumption may be required.

SUMMARY OF THE INVENTION

According to an aspect of an exemplary embodiment of the present invention, there is provided a frequency mixer with harmonic rejection, the mixer including an oscillator unit generating an oscillator signal having a ⅓ duty cycle; and a mixer unit generating an output signal by mixing an input signal with the oscillator signal.

The oscillator unit may include a first oscillator generating a first oscillator signal having a ⅓ duty cycle; and a second oscillator generating a second oscillator signal having a ⅓ duty cycle and a same frequency as and an opposite phase to the first oscillator signal, and the mixer unit may include a first mixer generating a first mixed signal by mixing the input signal with the first oscillator signal; a second mixer generating a second mixed signal by mixing the input signal with the second oscillator signal; and an output unit generating the output signal by subtracting the second mixed signal from the first mixed signal.

According to another aspect of an exemplary embodiment of the present invention, there is provided a frequency mixing method with harmonic rejection, the method including generating an oscillator signal having a ⅓ duty cycle; and generating an output signal by mixing an input signal with the oscillator signal.

The generating of the oscillator signal may include generating a first oscillator signal having a ⅓ duty cycle; and generating a second oscillator signal having a ⅓ duty cycle and a same frequency as and an opposite phase to the first oscillator signal, and the generating of the output signal may include generating a first mixed signal by mixing the input signal with the first oscillator signal; generating a second mixed signal by mixing the input signal with the second oscillator signal; and generating the output signal by subtracting the second mixed signal from the first mixed signal.

According to another aspect of an exemplary embodiment of the present invention, there is provided a ⅓ duty cycle oscillator apparatus including an oscillator unit generating first through fourth oscillator signals having a ½ duty cycle, a same frequency, and phases of 0°, 90°, 180° and 270° respectively; a first division unit generating a fifth oscillator signal having a ⅓ duty cycle and a ⅓ frequency of the first oscillator signal by dividing the first oscillator signal by three; a second division unit generating a sixth oscillator signal having a ⅓ duty cycle and a ⅓ frequency of the second oscillator signal by dividing the second oscillator signal by three; a third division unit generating a seventh oscillator signal having a ⅓ duty cycle and a ⅓ frequency of the third oscillator signal by dividing the third oscillator signal by three; and a fourth division unit generating an eighth oscillator signal having a ⅓ duty cycle and a ⅓ frequency of the fourth oscillator signal by dividing the fourth oscillator signal by three, wherein the fifth through eighth oscillator signals respectively have phases of 0°, 270°, 180° and 90°.

According to another aspect of an exemplary embodiment of the present invention, there is provided a ⅓ duty cycle oscillator signal generating method including generating first through fourth oscillator signals having a ½ duty cycle, a same frequency, and phases of 0°, 90°, 180° and 270° respectively; generating a fifth oscillator signal having a ⅓ duty cycle and a ⅓ frequency of the first oscillator signal by dividing the first oscillator signal by three; generating a sixth oscillator signal having a ⅓ duty cycle and a ⅓ frequency of the second oscillator signal by dividing the second oscillator signal by three; generating a seventh oscillator signal having a ⅓ duty cycle and a ⅓ frequency of the third oscillator signal by dividing the third oscillator signal by three; and generating an eighth oscillator signal having a ⅓ duty cycle and a ⅓ frequency of the fourth oscillator signal by dividing the fourth oscillator signal by three, wherein the fifth through eighth oscillator signals respectively have phases of 0°, 270°, 180° and 90°.

According to another aspect of an exemplary embodiment of the present invention, there is provided a ⅓ duty cycle oscillator apparatus including an oscillator unit generating first and second oscillator signals having a ½ duty cycle, a same frequency, and opposite phases; a first division unit generating a third oscillator signal having a ⅓ duty cycle and a ⅓ frequency of the first oscillator signal by dividing the first oscillator signal by three; and a second division unit generating a fourth oscillator signal having a ⅓ duty cycle and a ⅓ frequency of the second oscillator signal by dividing the second oscillator signal by three; wherein the third and fourth oscillator signals have opposite phases.

According to another aspect of an exemplary embodiment of the present invention, there is provided a ⅓ duty cycle oscillator signal generating method including generating first and second oscillator signals having a ½ duty cycle, a same frequency, and opposite phases; generating a third oscillator signal having a ⅓ duty cycle and a ⅓ frequency of the first oscillator signal by dividing the first oscillator signal by three; and generating a fourth oscillator signal having a ⅓ duty cycle and a ⅓ frequency of the second oscillator signal by dividing the second oscillator signal by three; wherein the third and fourth oscillator signals have opposite phases.

BRIEF DESCRIPTION OF THE DRAWINGS

The above and other features of exemplary embodiments of the present invention will become more apparent by describing in detail exemplary embodiments thereof with reference to the attached drawings in which:

FIG. 1 is a schematic structural diagram of an exemplary down converter used in a wireless communication system;

FIG. 2 illustrates exemplary graphs of a square wave having a ½ duty cycle, and a frequency spectrum of the square wave;

FIG. 3 illustrates exemplary graphs of a square wave having a ⅓ duty cycle, and a frequency spectrum of the square wave;

FIG. 19 is an exemplary flowchart of a frequency mixing method with harmonic rejection, according to an exemplary embodiment of the present invention;

FIG. 20 is an exemplary flowchart of a frequency mixing method with harmonic rejection, according to another exemplary embodiment of the present invention;

FIG. 21 is an exemplary flowchart of a ⅓ duty cycle quadrature oscillator signal generating method, according to an exemplary embodiment of the present invention.

DETAILED DESCRIPTION OF EXEMPLARY EMBODIMENTS OF THE INVENTION

Figure 4:
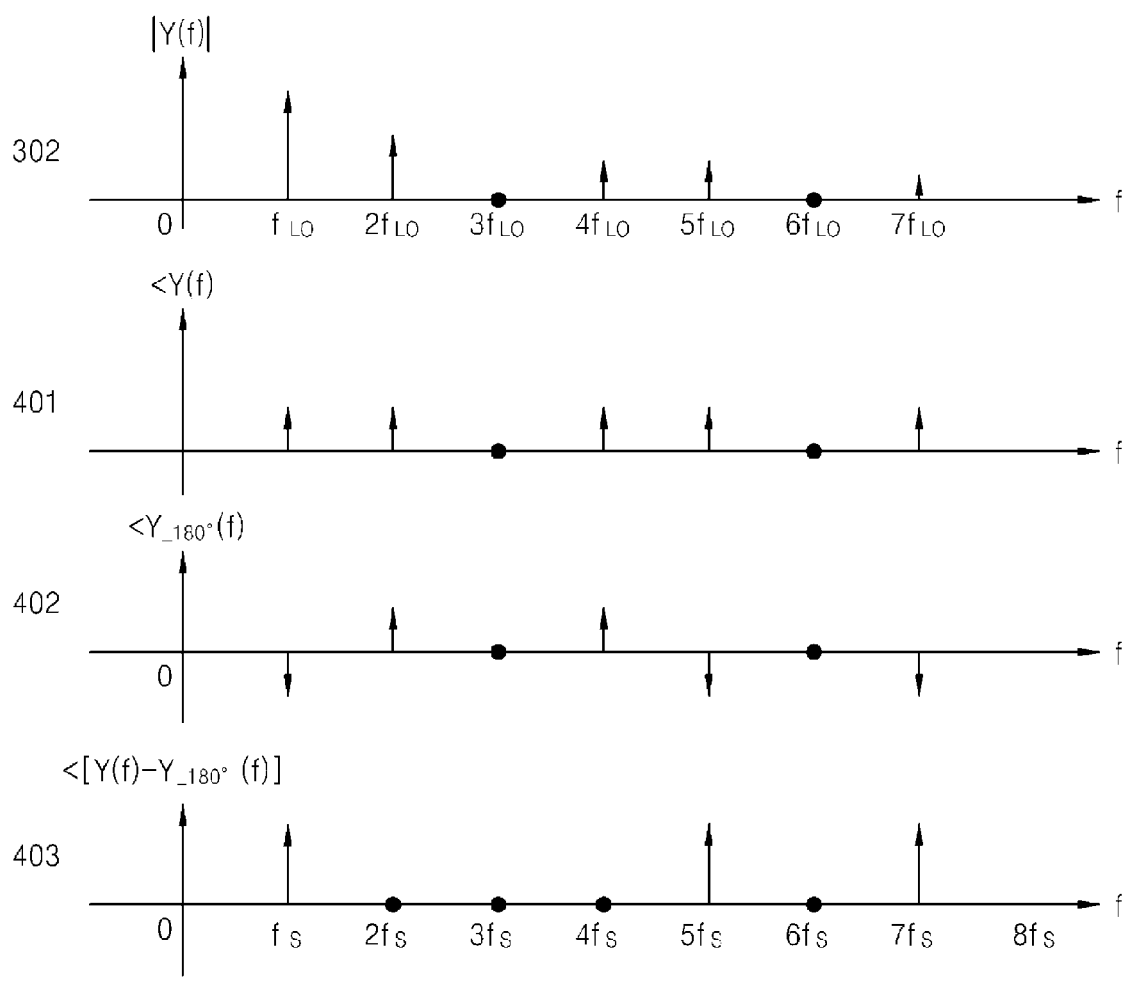
FIG. 4 is an exemplary phase diagram for describing an even-order harmonic rejection method, according to an exemplary embodiment of the present invention.

Hereinafter, the present invention will be described in detail by explaining exemplary embodiments of the invention with reference to the attached drawings. In the following description of the exemplary embodiments of the present invention, a detailed description of known functions and configurations incorporated herein may be omitted when not necessary to clarify aspects of the exemplary embodiments of the present invention. When a part "comprises" or "includes" an element, unless otherwise described, the part may further comprise or include other elements. For convenience of explanation, if necessary, an apparatus may be described together with a method.

In the drawings, like reference numerals denote like elements and elements illustrated in a different drawing may be referred to when another drawing is described. The sizes of elements in the drawings may be exaggerated for clarity of explanation.

FIG. 1 is an exemplary schematic structural diagram of a down converter such as those that may be used in a wireless communication system.

Referring to FIG. 1, the down converter may multiply a local oscillator (LO) signal 102 by a radio frequency (RF) signal 101 received from an antenna, by using a frequency mixer 110, and may output an intermediate frequency (IF) or baseband signal 103. In this exemplary case, if the LO signal 102 is not a pure sine wave, harmonics of the LO signal 102 may be mixed with other channels of the RF signal 101, thereby may generate noise in an output signal.

FIG. 2 illustrates graphs of a square wave 201 having a period T, a frequency $f_{LO}$, and a ½ duty cycle. FIG. 2 also illustrates a frequency spectrum 202 of the square wave 201. When the square wave 201 having a ½ duty cycle is used as the LO signal 102 illustrated in FIG. 1, even-order harmonic components do not exist in the LO signal 102 (as shown in the frequency spectrum 202) and thus noise due to even-order harmonics is not generated in an output signal.

FIG. 3 illustrates exemplary graphs of a square wave 301 having a ⅓ duty cycle. FIG. 3 also illustrates a frequency spectrum 302 of the square wave 301. In the square wave 301 having a ⅓ duty cycle, every-third-order harmonic components of the frequency spectrum 302 do not exist. Based on such a fact, embodiments in accordance with aspects of exemplary embodiments of the present invention may provide an every-third-order harmonic rejection effect by using the square wave 301 having a ⅓ duty cycle as the LO signal 102 as illustrated in FIG. 1. As such, third-order harmonics may be rejected, and the use of a multi-phase LO with gain control may not be required.

Unlike the square wave 201 having a ½ duty cycle, even-order harmonics exist in the square wave 301 having a ⅓ duty cycle. An exemplary embodiment of a method of additionally rejecting even-order harmonics will now be described with reference to FIGS. 4 and 5.

FIG. 4 is an exemplary phase diagram for describing an exemplary even-order harmonic rejection method, according to an exemplary embodiment of the present invention.

Referring to FIG. 4, when it is assumed that the phase of every frequency component of the square wave 301 having a ⅓ duty cycle, which is illustrated in FIG. 3, is 0° as shown in a frequency spectrum 401 for convenience of explanation, if the square wave 301 is phase-shifted by 180°, the phases of a basic frequency and odd-order harmonics are shifted by 180° and the phases of even-order harmonics are maintained at 0°, as shown in a frequency spectrum 402. Thus, if a signal obtained by phase-shifting the square wave 301 by 180° is subtracted from the square wave 301, all of the even-order harmonics may be canceled out, as shown in a frequency spectrum 403.

Figure 5:
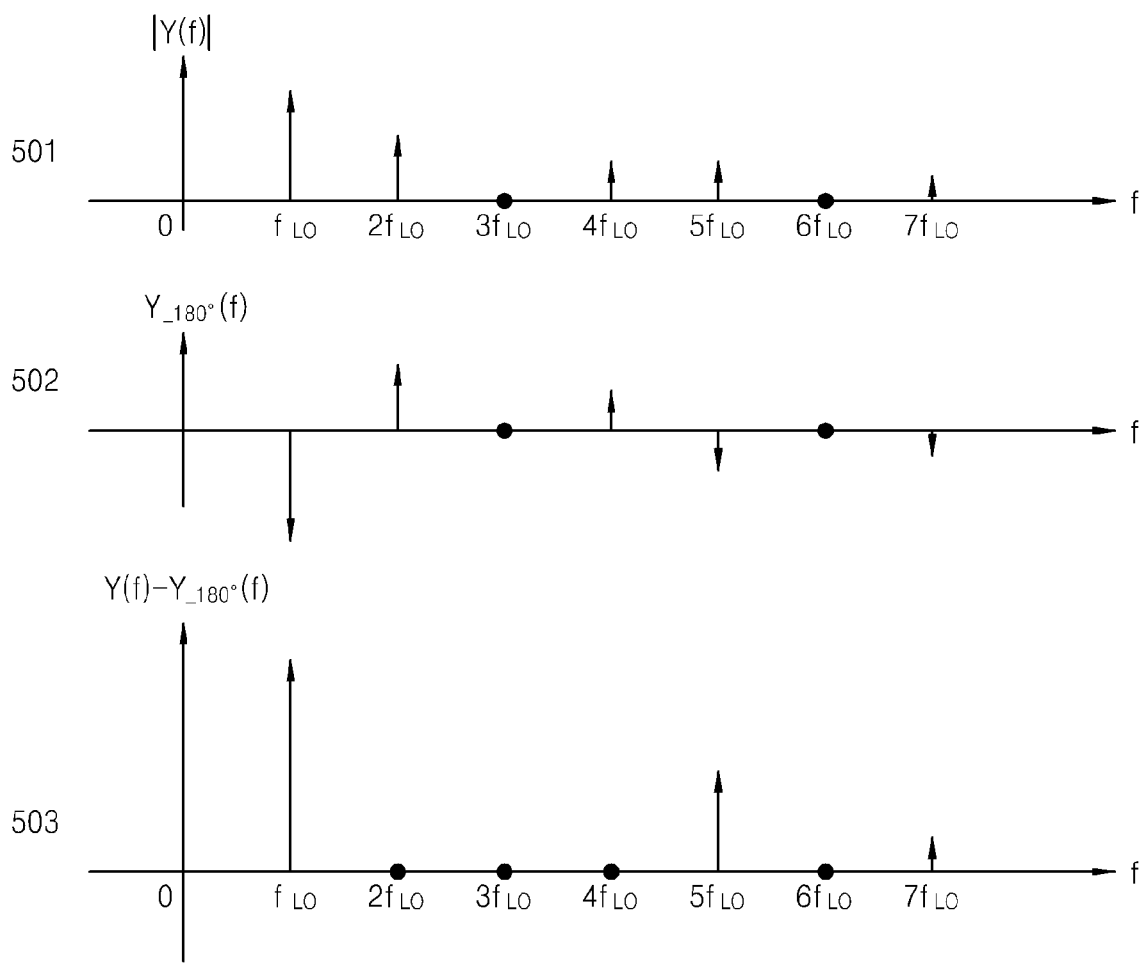
FIG. 5 illustrates exemplary graphs of frequency spectrums for describing an even-order harmonic rejection method, according to an exemplary embodiment of the present invention.

FIG. 5 illustrates exemplary graphs of frequency spectrums for describing an exemplary even-order harmonic rejection method, according to an exemplary embodiment of the present invention.

Referring to FIG. 5, when it is assumed that the phase of every frequency component of the square wave 301 having a ⅓ duty cycle, which is illustrated in FIG. 3, is 0° for convenience of explanation, the square wave 301 has a frequency spectrum Y(f) 501. A signal obtained by phase-shifting the square wave 301 by 180° has a frequency spectrum $Y\_{180°}(f)$ 502. A frequency spectrum $Y(f)-Y\_{180°}(f)$ 503 from which even-order and every-third-order harmonics are rejected may be achieved by subtracting the frequency spectrum $Y\_{180°}(f)$ 502 from the frequency spectrum Y(f) 501. Thus, an exemplary harmonic rejection mixer according to an exemplary embodiment of the present invention may reject second-order through fourth-order harmonics. The even-order harmonics may also be rejected by using a modified method according to aspects of exemplary embodiments of the present invention, without departing from the scope of the present invention.

Figure 6:
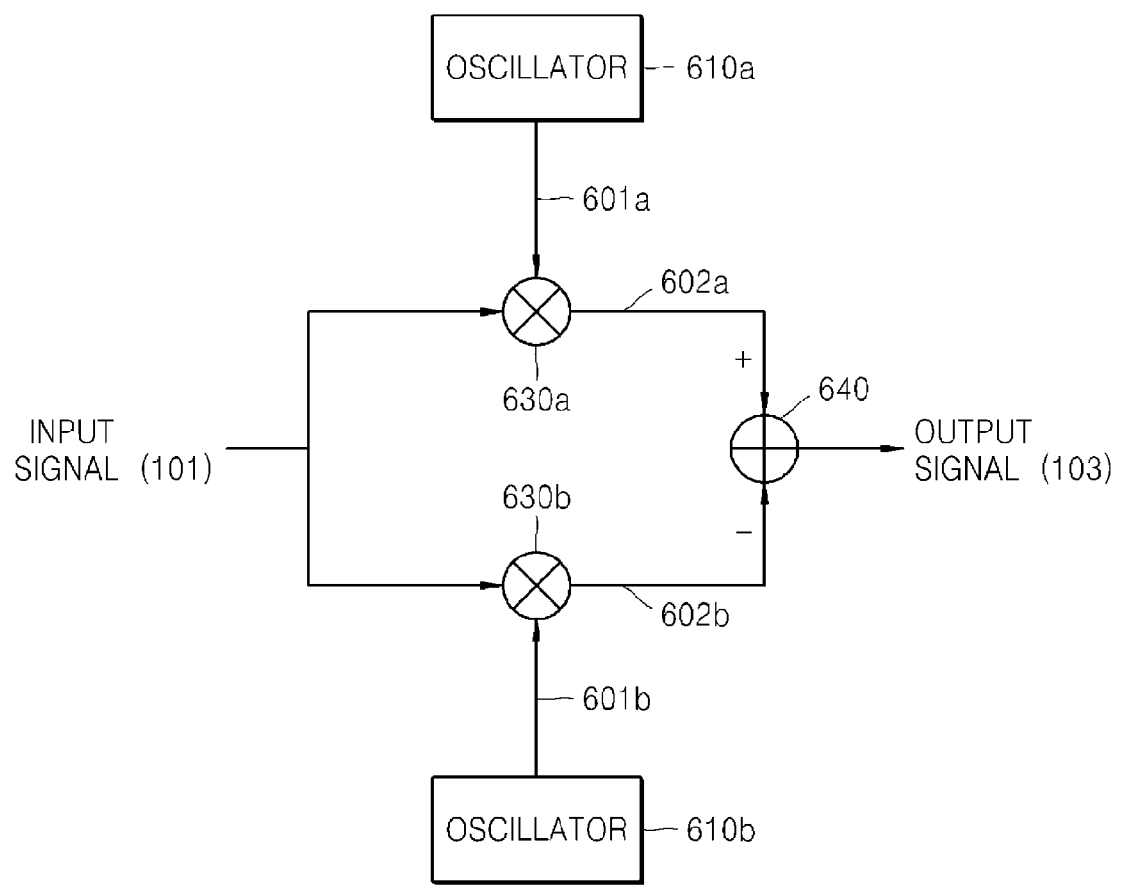
FIG. 6 is an exemplary schematic structural diagram of a harmonic rejection mixer, according to an exemplary embodiment of the present invention.

FIG. 6 is an exemplary schematic structural diagram of an exemplary harmonic rejection mixer according to an exemplary embodiment of the present invention.

Referring to FIG. 6, an exemplary harmonic rejection mixer according to the current exemplary embodiment may include oscillators 610a and 610b, mixers 630a and 630b, and an output unit 640. Although the following descriptions will be representatively given with respect to an exemplary case when an input signal 101, i.e., an RF signal received from an antenna, is down-converted into an output signal 103, i.e., a baseband signal, according to aspects of embodiments of the present invention, a harmonic rejection mixer may also be used for down-conversion from an RF signal into an IF signal, or from an IF signal into a baseband signal without departing from the scope of the present invention, or may, for example, be used for up-conversion at a transmitter side.

Figure 8:
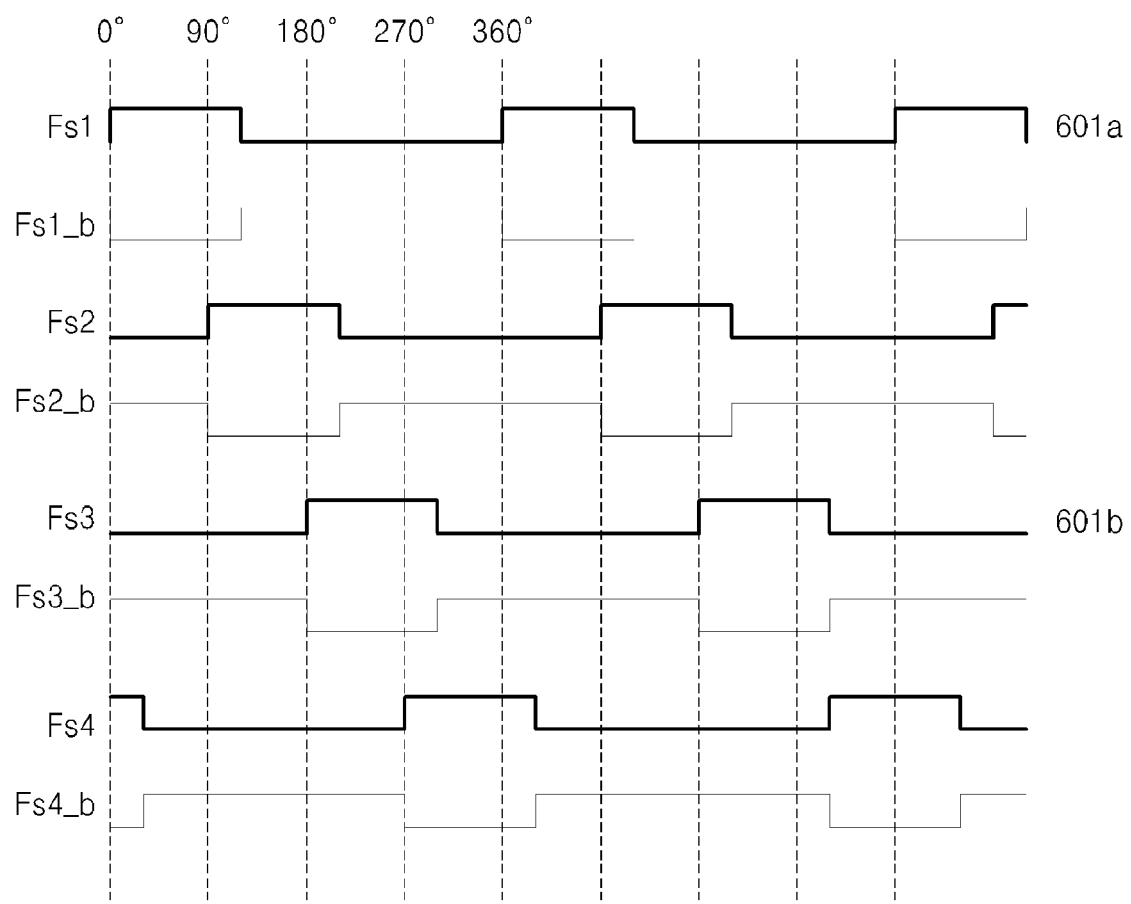
FIG. 8 is an exemplary timing diagram of oscillator signals having a ⅓ duty cycle and different phases, according to an exemplary embodiment of the present invention.

The oscillator 610a may generate an oscillator signal 601a having a ⅓ duty cycle and a frequency that is the same as a carrier frequency of the input signal 101. The oscillator 610b may generate an oscillator signal 601b having a ⅓ duty cycle, a frequency that is the same as that of an oscillator signal 601a, and a phase that is 180°-shifted from that of an oscillator signal 601a. Exemplary waveforms of the oscillator signals 601a and 601b are illustrated in FIG. 8.

The mixer 630a mixes the input signal 101 with the oscillator signal 601a so as to generate the output signal 602a, and the mixer 630b mixes the input signal 101 with the oscillator signal 601b so as to generate the output signal 602b. In this exemplary case, since the oscillator signals 601a and 601b have a ⅓ duty cycle, the influence of every-third-order harmonic components is removed. The output unit 640 subtracts the output signal 602b from the output signal 602a so as to generate the output signal 103 from which the influence of even-order harmonic components is removed. Thus, the ultimate output signal 103 may be a baseband signal from which even-order and every-third-order harmonics, and more particularly, second-order through fourth-order harmonics are rejected.

The exemplary harmonic rejection mixer as illustrated in FIG. 6 will now be described in detail with reference to FIGS. 7 through 9.

Figure 7:
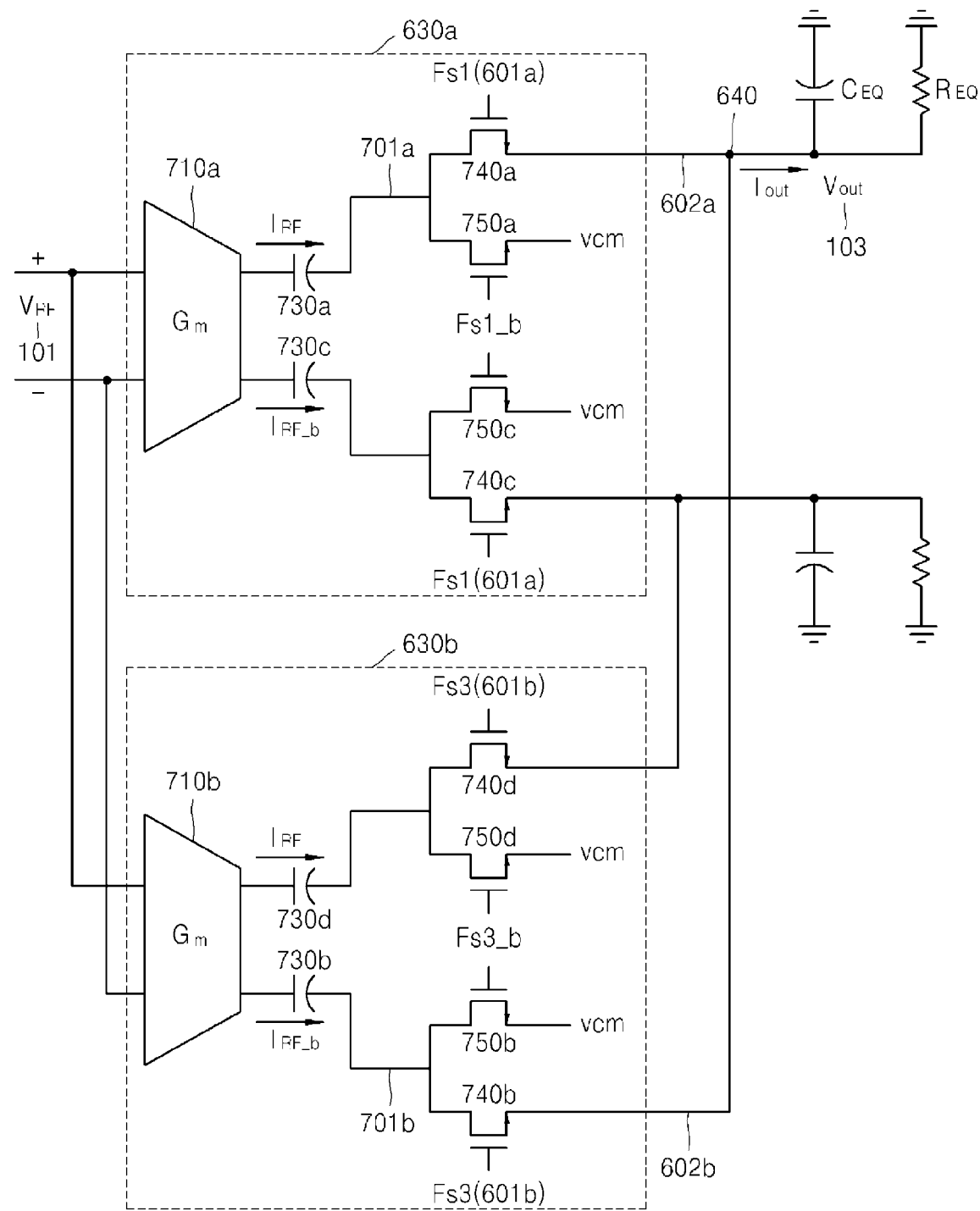
FIG. 7 illustrates an exemplary circuit of the harmonic rejection mixer illustrated in FIG. 6, according to an exemplary embodiment of the present invention.

FIG. 7 illustrates an exemplary circuit of the harmonic rejection mixer illustrated in FIG. 6, according to an exemplary embodiment of the present invention.

Referring to FIG. 7, in an upper circuit represented by "a" (710a, 730a, 740a, 750a, 701a, 601a and 602a), an input signal $V_{RF}$ 101 may be converted into a current signal $I_{RF}$ 701a by a transconductance 710a and then may be switched by a switch 740a controlled by an oscillator signal fs1 601a. When a voltage is switched, a voltage drop may be caused by the resistance of a switch and influence an output voltage, the resistance of the switch may vary according to an input voltage, and thus nonlinear characteristics may be added to the output voltage. Also, a parasitic capacitance may influence the output voltage if the switch is large, and thus the size of the switch may need to be optimized. In the current exemplary embodiment, the switch 740a switches a current instead of a voltage due to the transconductance 710a. Thus, according to aspects of the present exemplary embodiments, the size of a switch may be freely determined. The transconductance 710a may be realized by using a transconductance cell (Gm cell), an operational transconductance amplifier (OTA), or the like. Also, in order to remove flicker noise that may be generated in proportion to a direct current (DC) flowing through the switch 740a, the DC flowing through the switch 740a may be blocked by a DC blocking capacitor 730a between the transconductance 710a and the switch 740a.

While the switch 740a is open, the current signal $I_{RF}$ 701a flows into a common mode voltage Vcm by a switch 750a controlled by an inverted oscillator signal fs1_b. This structure bypasses the current signal $I_{RF}$ 701a to another region in order to prevent the current signal $I_{RF}$ 701a from being stored in a parasitic capacitor of the switch 750a and thus may influencing the output voltage.

A lower circuit represented by "b" (710b, 730b, 740b, 750b, 701b, 601b and 602b) may operate similarly to the upper circuit, a 180° phase-shifted oscillator signal fs3 601b is used instead of the oscillator signal fs1 601a to remove even-order harmonics and an inverted current signal $I_{RF\_b}$ 701b is used for subtraction at a node 640. A capacitor $C_{EQ}$ and a resistor $R_{EQ}$ equivalently represent load impedance of the harmonic rejection mixer. Thus, a signal 602a obtained by switching the current signal $I_{RF}$ 701a according to the oscillator signal fs1 601a is added to a signal 602b obtained by switching the inverted current signal $I_{RF}$_b 701b according to the 180° phase-shifted oscillator signal fs3 601b at the node 640 so as to generate an output current signal $I_{out}$. The output current signal $I_{out}$ may be converted into an output voltage signal $V_{out}$ 103 due to the load impedance represented by the capacitor $C_{EQ}$ and the resistor $R_{EQ}$.

The other circuits represented by "c" and "d" (730c, 730d, 740c, 740d, 750c and 750d) may be used to perform a differential operation. The differential circuit is well-known to one of ordinary skill in the art and thus a detailed description thereof is not provided so as not to obscure the subject matter of aspects of exemplary embodiments of the present invention. According to another exemplary embodiment of the present invention, these circuits may be removed and the harmonic rejection mixer may be realized as a single-ended circuit.

FIG. 8 is an exemplary timing diagram of oscillator signals fs1 through fs4 having a ⅓ duty cycle and different phases, according to an exemplary embodiment of the present invention.

Referring to FIG. 8, each of the oscillator signals fs1 through fs4 may have a ⅓ duty cycle such that every-third-order harmonics do not exist. The oscillator signals fs1 (601a) and fs3 (601b) have a 180° phase difference such that even-order harmonics may be rejected by using the oscillator signals fs1 and fs3. Also, the oscillator signals fs2 and fs4 may have a 180° phase difference such that even-order harmonics may be rejected by using the oscillator signals fs2 and fs4. The oscillator signals fs1 and fs2, and the oscillator signals fs3 and fs4 may have a 90° phase difference such that a quadrature mixer may be realized by using the four oscillator signals fs1 through fs4. That is, second-order through fourth-order harmonics may be rejected by using the oscillator signals fs1 and fs3 to demodulate an in-phase (I) signal, and by using the oscillator signals f2 and f4 to demodulate a quadrature-phase (Q) signal.

Figure 9:
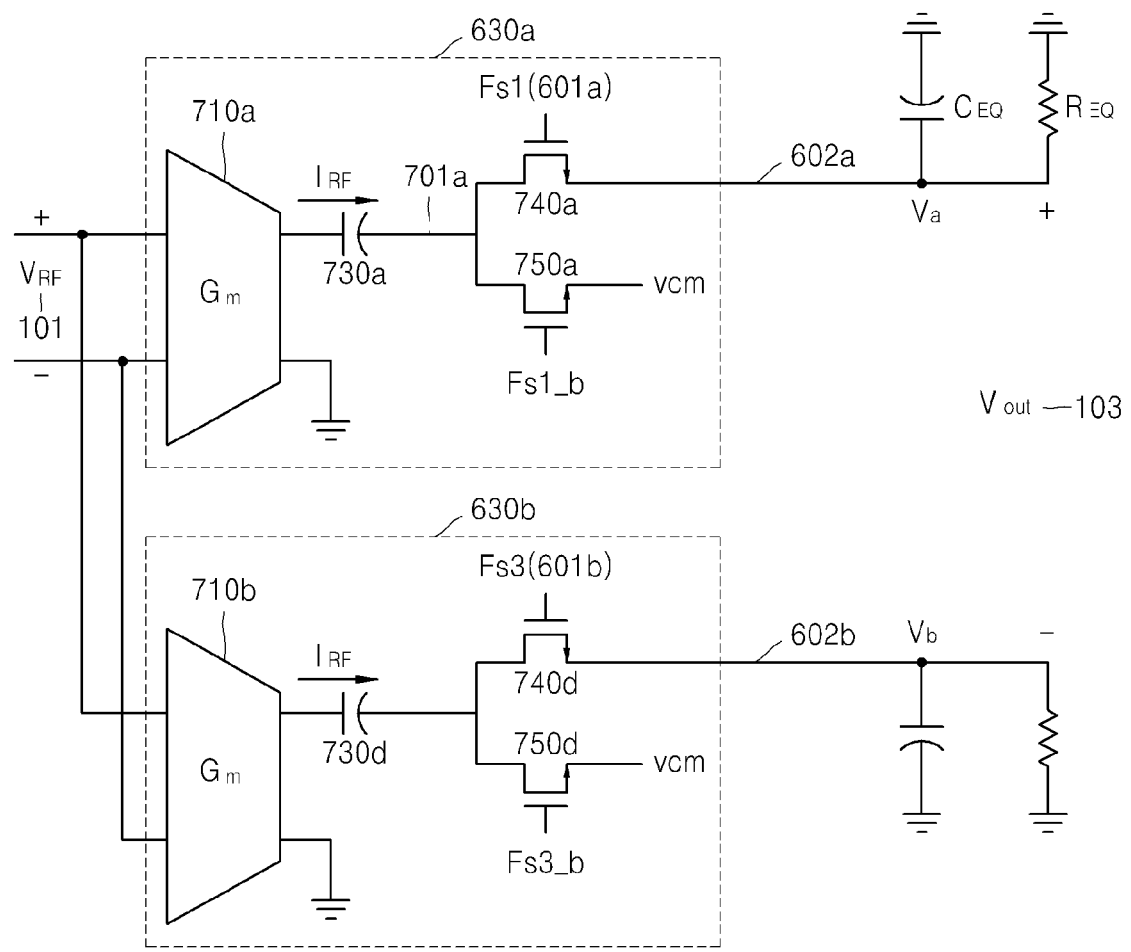
FIG. 9 illustrates an exemplary circuit of the harmonic rejection mixer illustrated in FIG. 6, according to another exemplary embodiment of the present invention.

FIG. 9 illustrates another exemplary circuit of the harmonic rejection mixer illustrated in FIG. 6, according to another exemplary embodiment of the present invention.

Referring to FIG. 9, the mixers 630a and 630b respectively switch the same current signal $I_{RF}$ by using oscillator signals fs1 601a and fs3 601b, switched current signals 602a and 602b are respectively converted into voltages Va and Vb due to load impedance, and a difference between the voltages Va and Vb is output as an output voltage signal $V_{out}$ 103.

Aspects of the exemplary harmonic rejection mixer illustrated in FIG. 6 for rejecting second-order through fourth-order harmonics by using oscillator signals having a ⅓ duty cycle is described above. Exemplary oscillators 610a and 610b for generating oscillator signals having a ⅓ duty cycle and different phases in the harmonic rejection mixer illustrated in FIG. 6, will now be described in more detail with reference to FIGS. 10 through 17.

Figure 10:
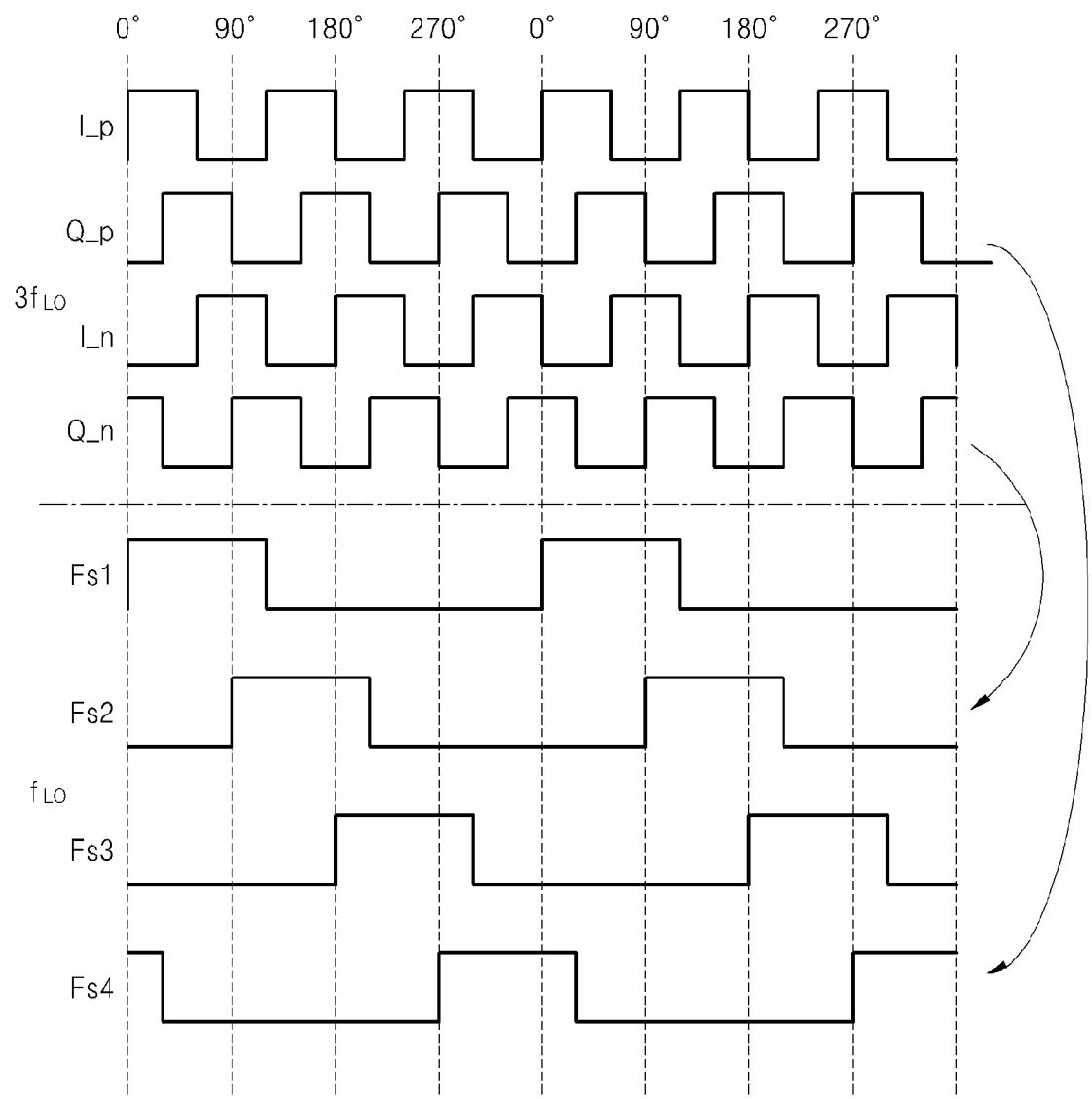
FIG. 10 is an exemplary timing diagram for describing a method of generating quadrature oscillator signals having a ⅓ duty cycle illustrated in FIG. 8, by using a quadrature oscillator, according to an exemplary embodiment of the present invention.

FIG. 10 is an exemplary timing diagram for describing an exemplary method of generating quadrature oscillator signals fs1 through fs4 having a ⅓ duty cycle illustrated in FIG. 8, by using a quadrature oscillator, according to an exemplary embodiment of the present invention.

Referring to FIG. 10, the frequency of the LO signals generated by the oscillators 610a and 620b is $f_{LO}$, which may be the same as an RF carrier frequency, the oscillators 610a and 620b may receive quadrature oscillator signals I_p, Q_p, I_n and Q_n having a ½ duty cycle and phases of 0°, 90°, 180° and 270° respectively from a quadrature oscillator having a frequency of $3f_{LO}$ three times greater than $f_{LO}$. The quadrature oscillator signals I_p, Q_p, I_n, and Q_n may be divided by three so as to generate the quadrature oscillator signals fs1, fs4, fs3 and fs2 having a ⅓ duty cycle and phases of 0°, 270°, 180° and 90° respectively. Here, the oscillator signal Q_n having a phase of 270° at the frequency $3f_{LO}$ may be used in order to generate the oscillator signal f2 having a phase of 90° at the $f_{LO}$, and the oscillator signal Q_p having a phase of 90° at the frequency $3f_{LO}$ may be used in order to generate the oscillator signal f4 having a phase of 270° at the LO frequency $f_{LO}$.

Figure 11:
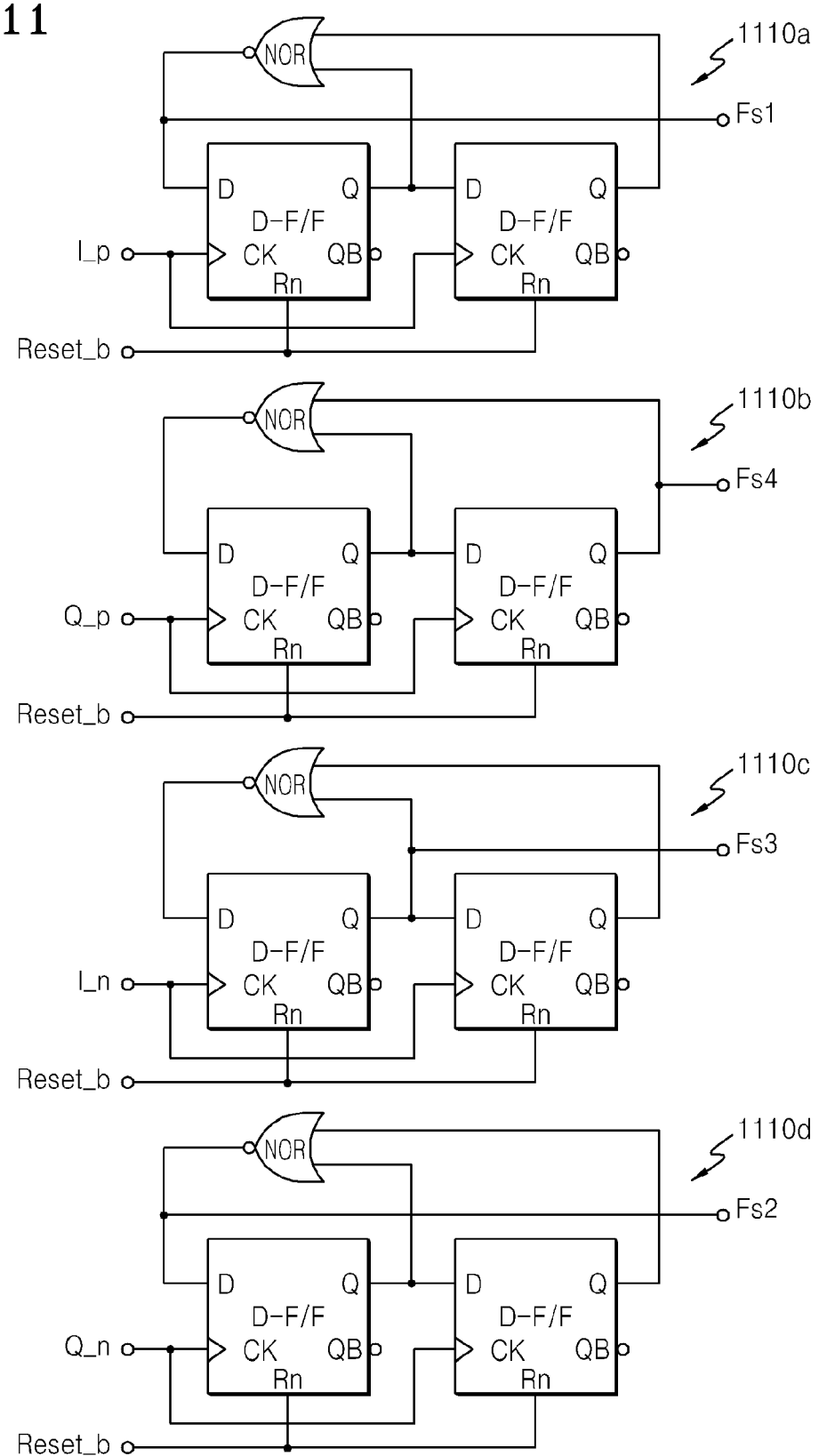
FIG. 11 illustrates an exemplary oscillator circuit for performing the method described by the timing diagram in FIG. 10, according to an exemplary embodiment of the present invention.

FIG. 11 illustrates an exemplary oscillator circuit for performing the method described by the timing diagram in FIG. 10, according to an exemplary embodiment of the present invention.

Referring to circuits 1110a through 1110d of FIG. 11, two flip-flops and one NOR gate may be used for each phase, and quadrature oscillator signals I_p, Q_p, I_n, and Q_n at the frequency $3f_{LO}$ may be used as clock signals of the flip-flops so as to be divided by three. In this exemplary case, since three edges of an oscillator signal at the frequency $3f_{LO}$ occur in a period of an oscillator signal at the frequency $f_{LO}$ as shown in FIG. 10, each oscillator signal at the frequency $f_{LO}$ may have one of three phase values.

In order to align the phases of oscillator signals fs1 through fs4, a signal of a particular node may be chosen as an output signal for each phase and a reset signal Reset_b of the flip-flops may be used. In the exemplary embodiment shown in FIG. 11, each of the oscillator signals fs1 and fs2 uses an output of the NOR gate as an output signal, the oscillator signal fs3 uses an output of a first flip-flop as an output signal, and the oscillator signal fs4 uses an output of a second flip-flop as an output signal. Thus, each of the oscillator signals fs1 and fs2 starts to generate pulses at a third clock edge after the reset signal Reset_b goes high, and the quadrature oscillator signals fs3 and fs4 respectively start to generate pulses at first and second clock edges.

Figure 12:
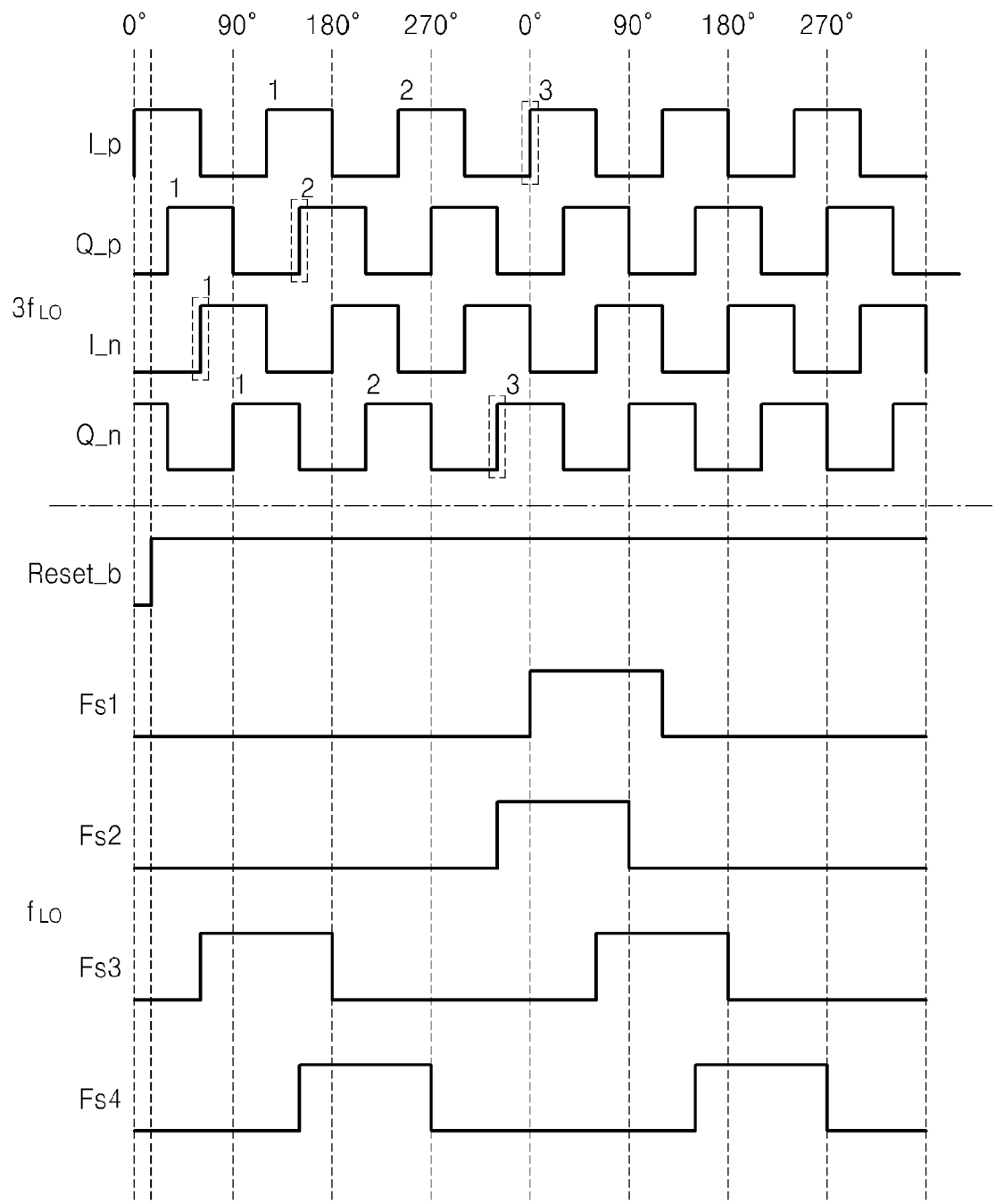
FIG. 12 illustrates an exemplary timing diagram of when an arbitrary reset signal is applied to the oscillator circuit illustrated in FIG. 11, according to aspects of an exemplary embodiment of the present invention.

FIG. 12 illustrates an exemplary timing diagram when an arbitrary reset signal Reset_b is applied to the oscillator circuit illustrated in the exemplary embodiment of FIG. 11, according to aspects of an exemplary embodiment of the present invention.

Referring to FIG. 12, an oscillator signal fs1 may start to generate pulses at a third rising edge of a quadrature oscillator signal I_p after the reset signal Reset_b goes high, and thus has a phase of 0°. An oscillator signal fs2 may start to generate pulses at a third rising edge of a quadrature oscillator signal Q_n after the reset signal Reset_b goes high, and thus may have a phase of 330°. A quadrature oscillator signal fs3 may start to generate pulses at a first rising edge of a quadrature oscillator signal I_n after the reset signal Reset_b goes high, and thus may have a phase of 60°. A quadrature oscillator signal fs4 may start to generate pulses at a second rising edge of a quadrature oscillator signal Q_p after the reset signal Reset_b goes high, and thus may have a phase of 150°. That is, although the quadrature oscillator signals fs1 through fs4 should, according to aspects of an exemplary embodiment of the present invention, respectively have phases of 0°, 90°, 180° and 270°, in FIG. 12, the quadrature oscillator signals fs1 through fs4 respectively have phases of 0°, 330°, 60° and 150°. In this exemplary case, even-order harmonics may not be rejected since the quadrature oscillator signals fs1 and fs3 do not have a 180° phase difference and quadrature mixing may not be performed since the quadrature oscillator signals fs1 and fs2 do not have a 90° phase difference.

Figure 13:
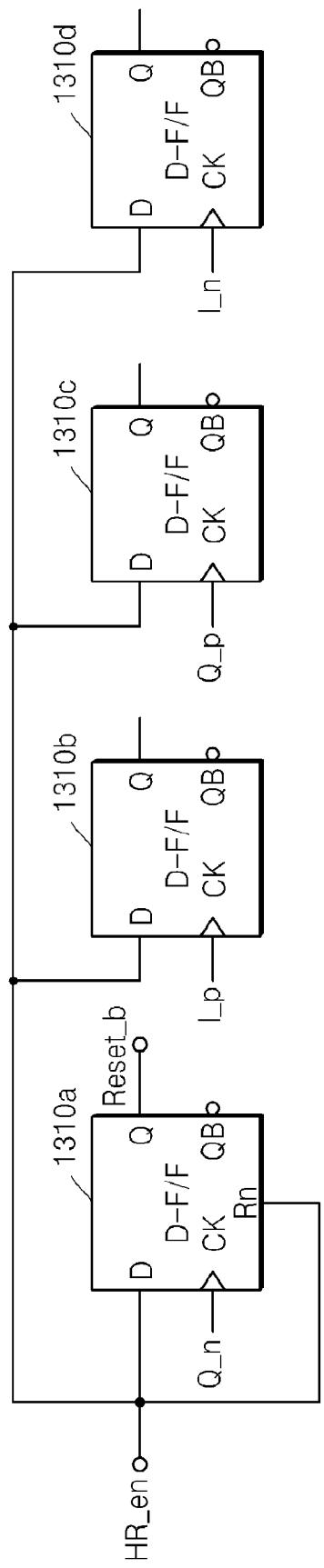
FIG. 13 illustrates a exemplary reset signal generating circuit for phase alignment of the oscillator circuit illustrated in FIG. 11, according to an exemplary embodiment of the present invention.

FIG. 13 illustrates an exemplary reset signal generating circuit for phase alignment of the exemplary oscillator circuit illustrated in FIG. 11, according to an exemplary embodiment of the present invention.

Referring to FIG. 13, after an enabling signal HR_en for starting operation of the oscillator circuit goes high, a reset signal Reset_b goes high by a flip-flop 1310a according to a rising edge of a quadrature oscillator signal Q_n having a phase of 270°. Here, flip-flops 1310b through 1310d may be dummy elements used to set the same load impedance for each channel of the oscillator at the frequency $3f_{LO}$, and may not perform any additional function.

Figure 14:
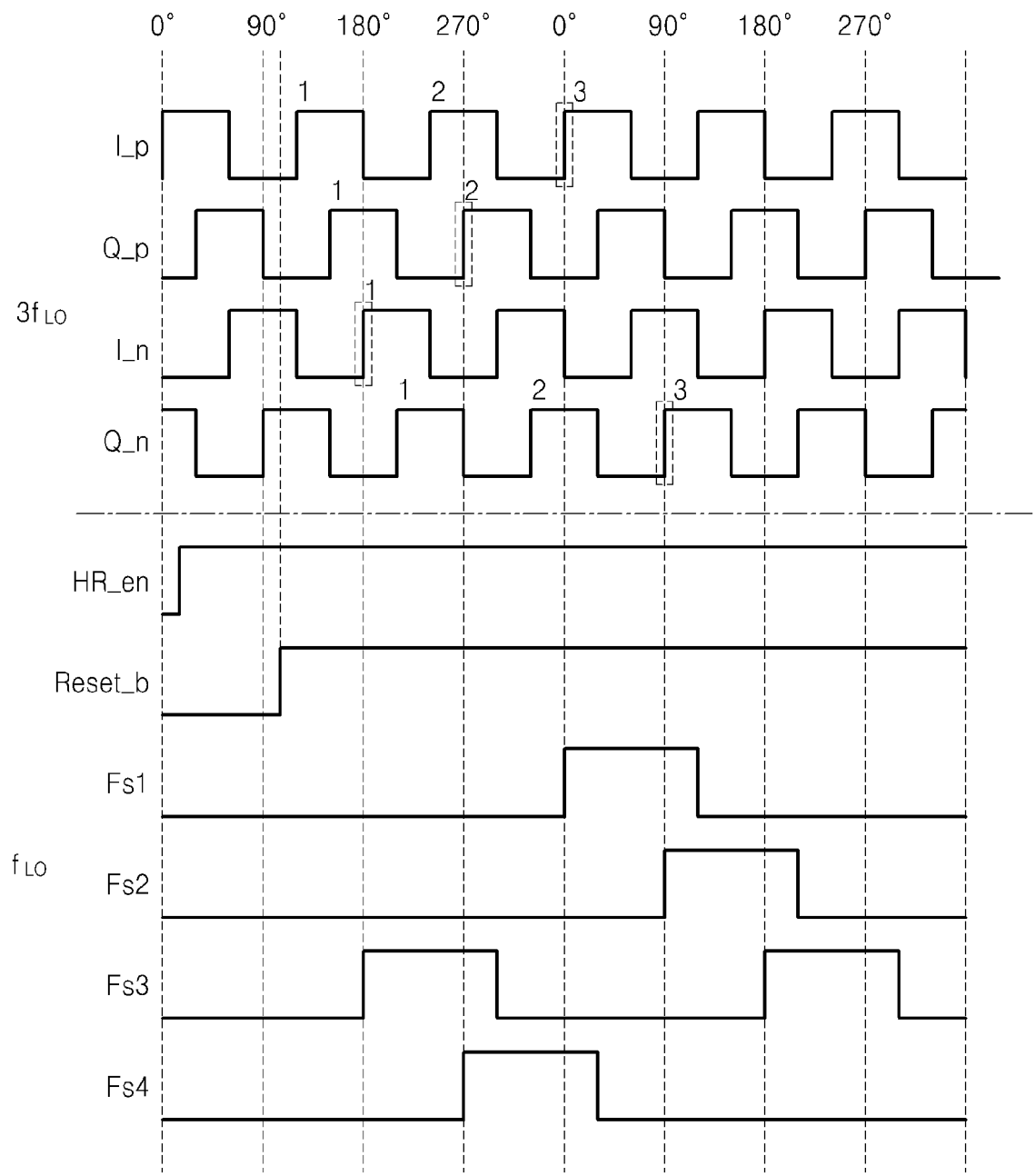
FIG. 14 is an exemplary timing diagram for describing phase alignment using the reset signal generating circuit illustrated in FIG. 13, according to aspects of an exemplary embodiment of the present invention.

FIG. 14 is an exemplary timing diagram for describing phase alignment using the reset signal generating circuit illustrated in FIG. 13.

Referring to FIG. 14, although an enabling signal HR_en goes high at a arbitrary location, a reset signal Reset_b goes high at a rising edge of an oscillator signal Q_n and thus oscillator signals fs1 through fs4 respectively may have phases of 0°, 90°, 180° and 270°.

Figure 15:
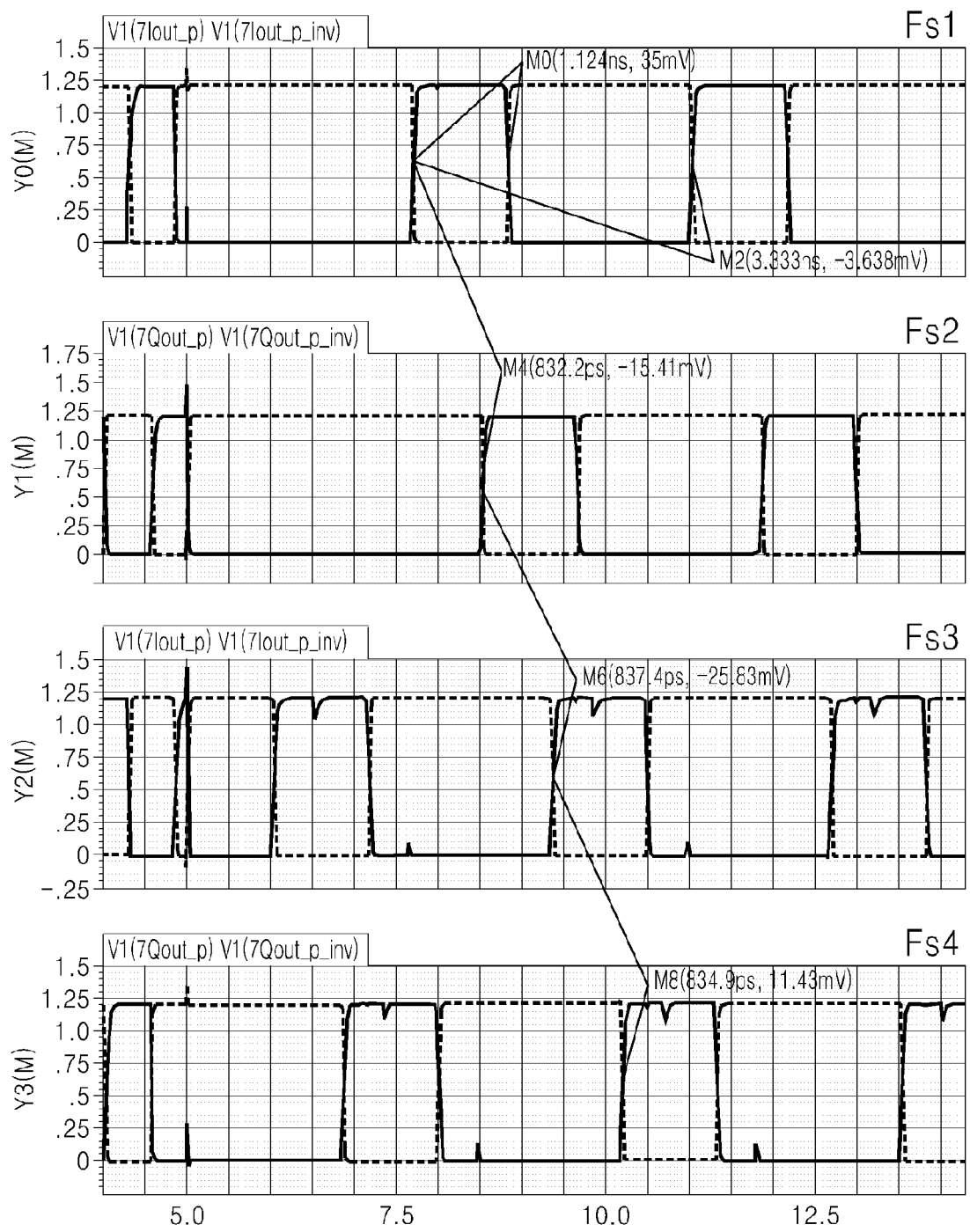
FIG. 15 illustrates exemplary graphs showing simulation results of the circuits illustrated in FIGS. 11 and 13, according to exemplary embodiments of the present invention.

FIG. 15 illustrates exemplary graphs showing simulation results of the exemplary circuits illustrated in FIGS. 11 and 13.

Referring to FIG. 15, phases of output quadrature oscillator signals fs1 through fs4 are aligned according to aspects of an exemplary embodiment of the present invention.

Figure 16:
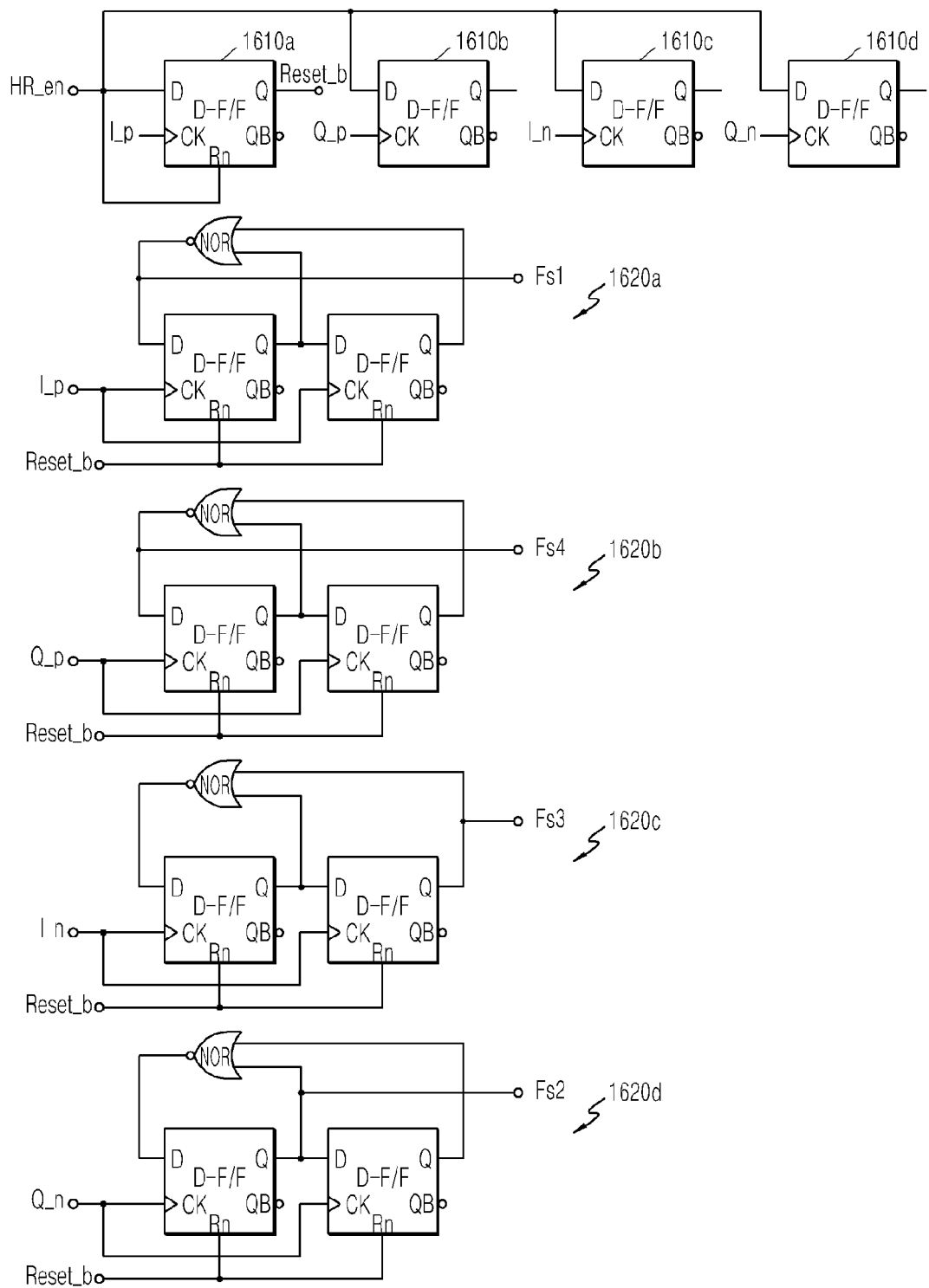
FIG. 16 illustrates an exemplary oscillator circuit according to another exemplary embodiment of the present invention.
Figure 17:
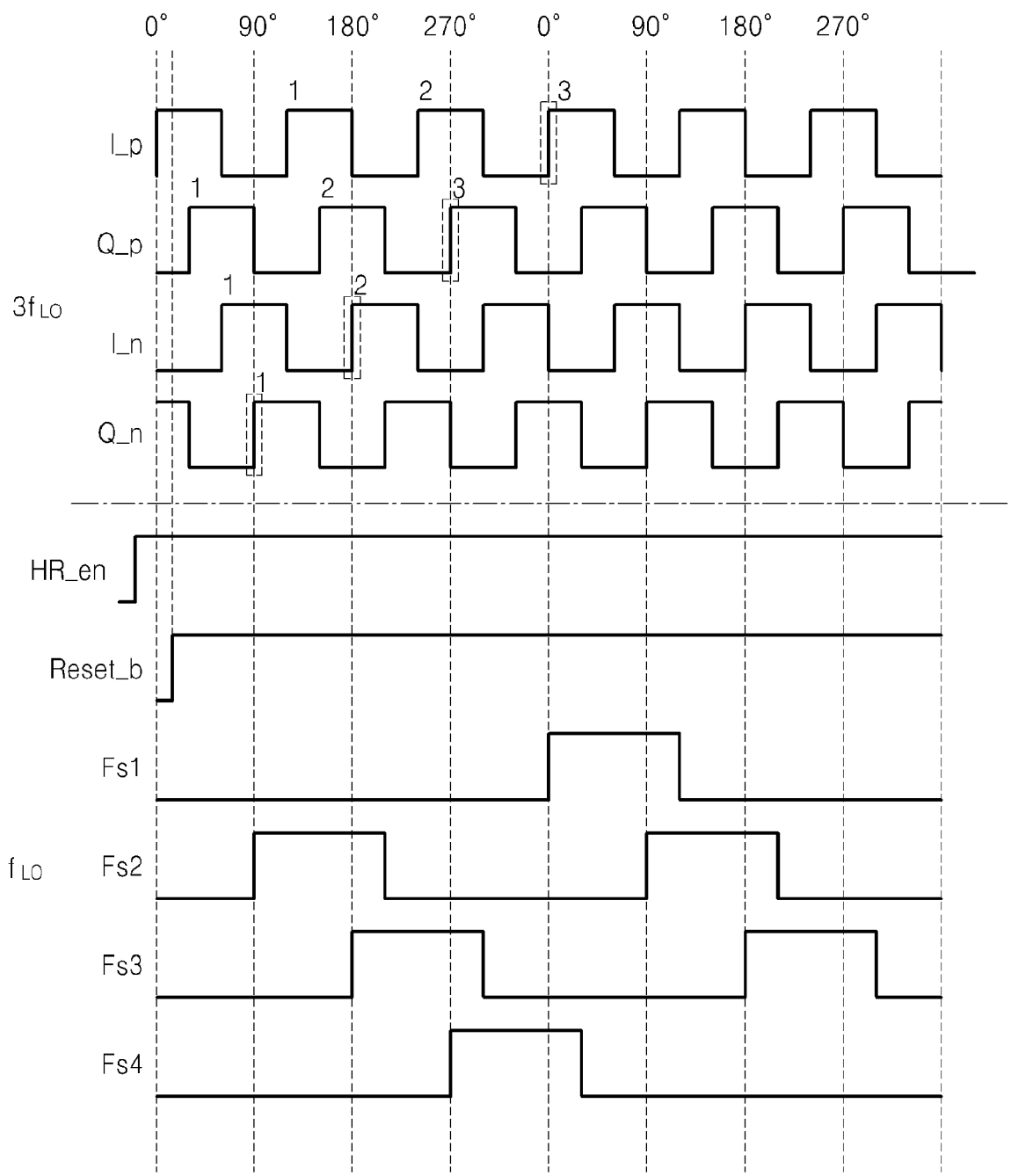
FIG. 17 is an exemplary timing diagram of the oscillator circuit illustrated in FIG. 16, according to aspects of an exemplary embodiment of the present invention.

FIG. 16 illustrates an exemplary oscillator circuit according to another exemplary embodiment of the present invention. FIG. 17 is an exemplary timing diagram of the oscillator circuit illustrated in FIG. 16.

Referring to FIG. 16, each of oscillator signals fs1 and fs4 may use an output of a NOR gate as an output signal, an oscillator signal fs2 may use an output of a first flip-flop as an output signal, an oscillator signal fs3 may use an output of a second flip-flop as an output signal, an oscillator signal I_p having a phase of 0° may be used as a clock for generating a reset signal Reset_b. Referring to FIG. 17, phases of the quadrature oscillator signals fs1 through fs4 are aligned according to aspects of an exemplary embodiment of the present invention.

When a differential mixer is realized, quadrature oscillator signals may not be necessary. Thus, in FIG. 16, circuits 1610b, 1610d, 1620b, and 1620d corresponding to quadrature phases may be removed and differential oscillator signals may be generated by using circuits 1610a, 1610c, 1620a, and 1620c.

Figure 18A:
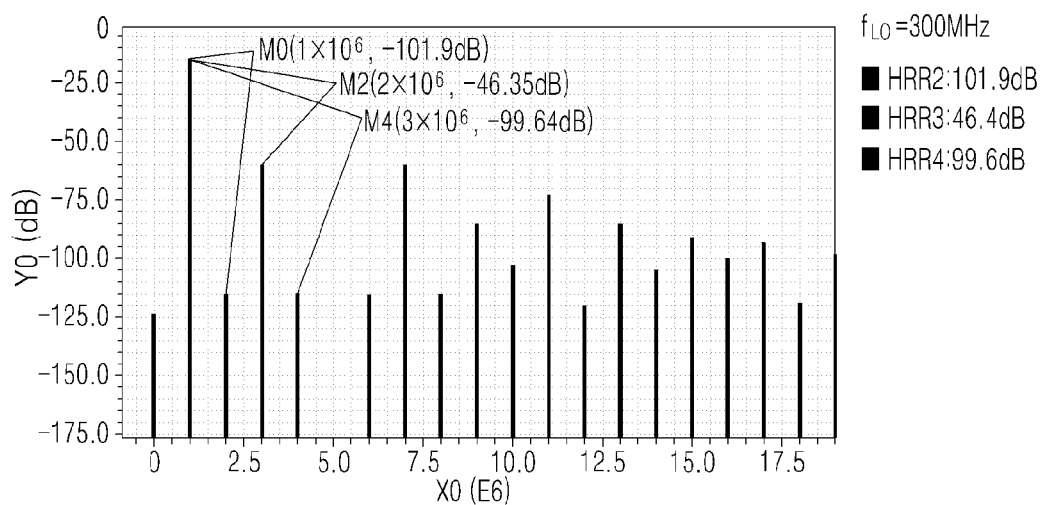
FIGS. 18A and 18B are exemplary graphs showing simulation results of the circuits illustrated in FIGS. 7, 11 and 13, according to aspects of an exemplary embodiment of the present invention.
Figure 18B:
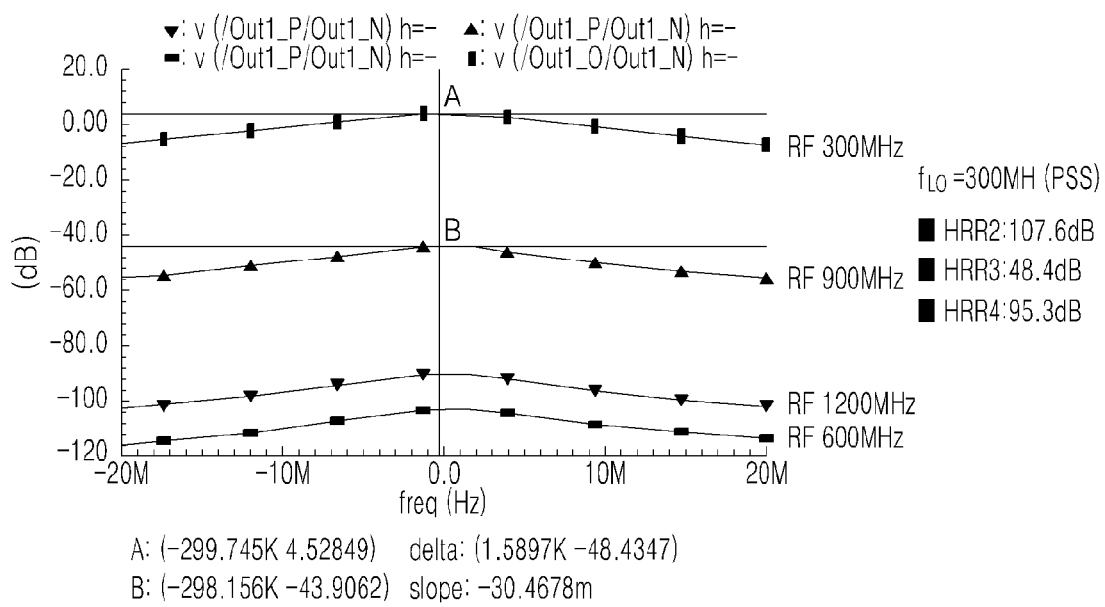

FIGS. 18A and 18B are exemplary graphs showing simulation results of the exemplary circuits illustrated in FIGS. 7, 11 and 13.

FIG. 18A is an exemplary graph showing a time domain simulation result and illustrates an exemplary spectrum obtained by down-converting an input RF signal having the same power at frequencies of 301 MHz, 602 MHz, 903 MHz and 1204 MHz to a baseband by using an exemplary harmonic rejection mixer according to an exemplary embodiment of the present invention. Thus, signals of 1 MHz, 2 MHz, 3 MHz, and 4 MHz respectively may represent a basic frequency component and second-order, third-order and fourth-order harmonic components. As shown in the exemplary graph of FIG. 18A, the second-order, third-order, and fourth-order harmonic components are respectively suppressed by 101.9 dB, 46.4 dB and 99.6 dB. In this exemplary embodiment, the reason why the third-order harmonic component is suppressed less than the second-order and fourth-order harmonic components is because, in the circuit illustrated in FIG. 7, on/off timings of a switch may slightly vary according to an output voltage. If the structure of the switch is modified so as not to be influenced by the output voltage, the third-order harmonic component may be suppressed more.

FIG. 18B is an exemplary graph showing periodic steady-state simulation (PSS) results and illustrates exemplary spectrums obtained by down-converting input signals, which have the same uniform power densities at frequency bands of 280~320 MHz, 580~620 MHz, 880~920 MHz and 1180~1220 MHz respectively, to a baseband by using an exemplary harmonic rejection mixer according to an exemplary embodiment of the present invention. As shown in the exemplary graph of FIG. 18B, the second-order, third-order, and fourth-order harmonic components are respectively suppressed by 107.6 dB, 48.4 dB and 95.3 dB. The PSS results of FIG. 18B are similar to the exemplary time domain simulation results of FIG. 18A.

FIG. 19 is an exemplary flowchart of a frequency mixing method with harmonic rejection, according to an exemplary embodiment of the present invention.

Referring to FIG. 19, the exemplary method according to the current embodiment may include generating an oscillator signal having a ⅓ duty cycle (operation S1910); and generating an output signal by mixing an input signal with the oscillator signal (operation S1920), and thereby may reject every-third-order harmonic components.

FIG. 20 is an exemplary flowchart of an exemplary frequency mixing method with harmonic rejection, according to another exemplary embodiment of the present invention.

Referring to FIG. 20, the exemplary method according to the current embodiment may include generating a first oscillator signal having a ⅓ duty cycle (operation S2010a); generating a second oscillator signal having a ⅓ duty cycle and the same frequency as and an opposite phase to the first oscillator signal (operation S2010b); generating a first mixed signal by mixing an input signal with the first oscillator signal (operation S2020a); generating a second mixed signal by mixing the input signal with the second oscillator signal (operation S2020b); and generating an output signal by subtracting the second mixed signal from the first mixed signal (operation S2030), and thereby may reject every-third-order and even-order harmonic components.

FIG. 21 is an exemplary flowchart of a ⅓ duty cycle quadrature oscillator signal generating exemplary method according to an exemplary embodiment of the present invention.

Referring to FIG. 21, the exemplary method according to the current embodiment may include generating first through fourth oscillator signals having a ½ duty cycle, the same frequency, and phases of 0°, 90°, 180° and 270° (operation S2110); generating a fifth oscillator signal having a ⅓ duty cycle and a ⅓ frequency of the first oscillator signal by dividing the first oscillator signal by three (operation S2120a); generating a sixth oscillator signal having a ⅓ duty cycle and a ⅓ frequency of the second oscillator signal by dividing the second oscillator signal by three (operation S2120b); generating a seventh oscillator signal having a ⅓ duty cycle and a ⅓ frequency of the third oscillator signal by dividing the third oscillator signal by three, (operation S2120c); and generating an eighth oscillator signal having a ⅓ duty cycle and a ⅓ frequency of the fourth oscillator signal by dividing the fourth oscillator signal by three (operation S2120d), and thereby may generate quadrature oscillator signals having a ⅓ duty cycle by allowing the fifth through eighth oscillator signals to respectively have phases of 0°, 270°, 180° and 90°.

Figure 22:
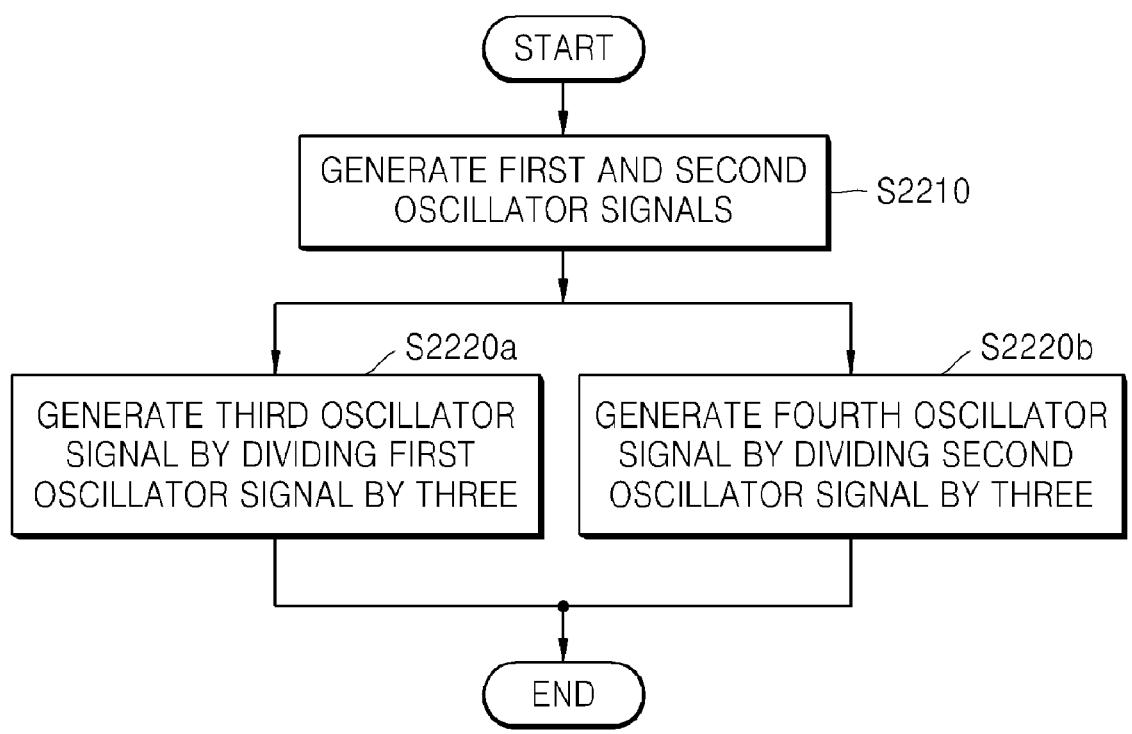
FIG. 22 is an exemplary flowchart of a ⅓ duty cycle differential oscillator signal generating method, according to an exemplary embodiment of the present invention.

FIG. 22 is an exemplary flowchart of a ⅓ duty cycle differential oscillator signal generating exemplary method according to an exemplary embodiment of the present invention.

Referring to FIG. 22, the exemplary method according to the current embodiment may include generating first and second oscillator signals having a ½ duty cycle, the same frequency, and opposite phases (operation S2210); generating a third oscillator signal having a ⅓ duty cycle and a ⅓ frequency of the first oscillator signal by dividing the first oscillator signal by three (operation S2220a); and generating a fourth oscillator signal having a ⅓ duty cycle and a ⅓ frequency of the second oscillator signal by dividing the second oscillator signal by three (operation S2220b), and thereby may generate differential oscillator signals by allowing the third and fourth oscillator signals to have opposite phases.

As described above, a harmonic rejection mixer according to aspects of exemplary embodiments of the present invention may reject harmonics differently than a conventional harmonic rejection mixer using a multi-phase. Unlike a conventional harmonic rejection mixer, which should set a different gain for each phase, a harmonic rejection mixer according to aspects of exemplary embodiments of the present invention may have the same gain and thus may prevent mismatches between parallel circuits. Furthermore, in a harmonic rejection mixer according to aspects of exemplary embodiments of the present invention, since quadrature oscillator signals that may be used in a general receiver are used, an additional multi-phase oscillator signal that may be generated in a conventional harmonic rejection mixer may not need to be generated. Also, since quadrature oscillator signals may be divided by only three, in comparison to a conventional harmonic rejection mixer that may divide higher frequency oscillator signals by a greater number, low power consumption may be achieved.

While the present invention has been particularly shown and described with reference to exemplary embodiments thereof, the exemplary embodiments should be considered in a descriptive sense only and not for purposes of limitation. The terms used herein to describe concepts of exemplary aspects of the present invention are for descriptive purposes only and are not intended to limit the scope of the invention. Accordingly, it will be understood by one of ordinary skill in the art that various changes in form and details may be made therein without departing from the spirit and scope of the following claims.

The scope of the invention is defined not by the detailed description of the invention but by the following claims, and all structural and functional equivalents within the scope will be construed as being included in the present invention. The equivalents should be construed to include equivalents to be developed in the future as well as currently known equivalents, that is, all components invented to perform the same function regardless of their structures. Additionally, expressions such as "at least one of", when preceding a list of elements, modify the entire list of elements and do not modify each element of the list.

What is claimed is:

1. A frequency mixer with harmonic rejection, the mixer comprising:
   an oscillator unit which generates an oscillator signal having a ⅓ duty cycle; and
   a mixer unit which generates an output signal by mixing an input signal with the oscillator signal.

2. The frequency mixer of claim 1, wherein the mixer unit generates the output signal by switching the input signal according to the oscillator signal.

3. The frequency mixer of claim 1, wherein the input signal is a voltage signal,
   wherein the mixer unit comprises:
   a transconductance which converts the input signal into a current signal; and
   a switch which generates the output signal using the current signal, and
   wherein the switch is turned on if the oscillator signal is in an active state, and the switch is turned off if the oscillator signal is in an inactive state.

4. The frequency mixer of claim 1, wherein the oscillator unit comprises:
   a first oscillator which generates a first oscillator signal having a ⅓ duty cycle; and
   a second oscillator which generates a second oscillator signal having a ⅓ duty cycle and a same frequency as and an opposite phase to the first oscillator signal, and
   wherein the mixer unit comprises:
   a first mixer which generates a first mixed signal by mixing the input signal with the first oscillator signal;
   a second mixer which generates a second mixed signal by mixing the input signal with the second oscillator signal; and
   an output unit which generates the output signal by subtracting the second mixed signal from the first mixed signal.

5. The frequency mixer of claim 4, wherein the first mixer generates the first mixed signal by switching the input signal according to the first oscillator signal, and
   wherein the second mixer generates the second mixed signal by switching the input signal according to the second oscillator signal.

6. The frequency mixer of claim 4, wherein the input signal is a voltage signal,
   wherein the first mixer comprises:
   a first transconductance which converts the input signal into a first current signal; and
   a first switch which generates the first mixed signal using the first current signal,
   wherein the first switch is turned on if the first oscillator signal is in an active state, and the first switch is turned off if the first oscillator signal is in an inactive state, and
   wherein the second mixer comprises:
   a second transconductance which converts the input signal into a second current signal; and
   a second switch which generates the second mixed signal using the second current signal,
   wherein the second switch is turned on if the second oscillator signal is in an active state, and the second switch is turned off if the second oscillator signal is in an inactive state.

7. A frequency mixing method with harmonic rejection, the method comprising:
   generating an oscillator signal having a ⅓ duty cycle; and
   generating an output signal by mixing an input signal with the oscillator signal.

8. The frequency mixing method of claim 7, wherein the generating of the output signal comprises switching the input signal according to the oscillator signal.

9. The frequency mixing method of claim 7, wherein the input signal is a voltage signal, and
   wherein the generating of the output signal comprises:
   converting the input signal into a current signal by using a transconductance; and determining the current signal as the output signal if the oscillator signal is in an active state, and determining a predetermined value as the output signal if the oscillator signal is in an inactive state.

10. The frequency mixing method of claim 7, wherein the generating of the oscillator signal comprises:
generating a first oscillator signal having a ⅓ duty cycle; and
generating a second oscillator signal having a ⅓ duty cycle and a same frequency as and an opposite phase to the first oscillator signal, and
wherein the generating of the output signal comprises:
generating a first mixed signal by mixing the input signal with the first oscillator signal;
generating a second mixed signal by mixing the input signal with the second oscillator signal; and
subtracting the second mixed signal from the first mixed signal.

11. The frequency mixing method of claim 10, wherein the generating of the first mixed signal comprises switching the input signal according to the first oscillator signal, and
wherein the generating of the second mixed signal comprises switching the input signal according to the second oscillator signal.

12. The frequency mixing method of claim 10, wherein the input signal is a voltage signal,
wherein the generating of the first mixed signal comprises:
converting the input signal into a first current signal by using a first transconductance; and
determining the first current signal as the first mixed signal if the first oscillator signal is in an active state, and determining a first predetermined value as the first mixed signal if the first oscillator signal is in an inactive state, and
wherein the generating of the second mixed signal comprises:
converting the input signal into a second current signal by using a second transconductance; and
determining the second current signal as the second mixed signal if the second oscillator signal is in an active state, and determining a second predetermined value as the second mixed signal if the second oscillator signal is in an inactive state.

13. The frequency mixing method of claim 9, wherein the predetermined value is 0.

14. The frequency mixing method of claim 12, wherein the first predetermined value is 0,
and wherein the second predetermined value is 0.

15. A ⅓ duty cycle oscillator apparatus comprising:
an oscillator unit which generates a first through a fourth oscillator signal, each having a ½ duty cycle, a same predetermined frequency, and phases of 0°, 90°, 180°, and 270° respectively;
a first division unit which generates a fifth oscillator signal having a ⅓ duty cycle and ⅓ the predetermined frequency of the first oscillator signal, by dividing the first oscillator signal by three;
a second division unit which generates a sixth oscillator signal having a ⅓ duty cycle and ⅓ the predetermined frequency of the second oscillator signal, by dividing the second oscillator signal by three;
a third division unit which generates a seventh oscillator signal having a ⅓ duty cycle and ⅓ the predetermined frequency of the third oscillator signal, by dividing the third oscillator signal by three; and
a fourth division unit which generates an eighth oscillator signal having a ⅓ duty cycle and ⅓ the predetermined frequency of the fourth oscillator signal, by dividing the fourth oscillator signal by three,
wherein the fifth through the eighth oscillator signals respectively each have phases of 0°, 270°, 180°, and 90°.

16. The ⅓ duty cycle oscillator apparatus of claim 15, further comprising:
a reset signal generating unit which generates a reset signal according to an edge of the first oscillator signal, the second oscillator signal, the third oscillator signal, or the fourth oscillator signal,
wherein operation of each of the first through the fourth division units is started according to the reset signal.

17. The ⅓ duty cycle oscillator apparatus of claim 16, wherein each of the first through the fourth division units starts to generate pulses of a corresponding generated oscillator signal if a predetermined number of edges of the corresponding divided oscillator signal are received, after operation is started according to the reset signal, and
wherein the predetermined number is one of 1 through 3.

18. The ⅓ duty cycle oscillator apparatus of claim 17, wherein each of the first through the fourth division units comprises a first flip-flop, a second flip-flop, and a NOR gate,
wherein for each of the first through the fourth division units, an output signal of the first flip-flop is used as an input signal of the second flip-flop,
wherein for each of the first through the fourth division units, output signals of the first and second flip-flops are used as input signals of the NOR gate,
wherein for each of the first through the fourth division units, an output signal of the NOR gate is used as an input signal of the first flip-flop,
wherein for each of the first through the fourth division units, the reset signal is used as reset signals of the first and second flip-flops,
wherein for each of the first through the fourth division units, the corresponding divided oscillator signal of each of the first through the fourth division units is used as clock signals of the first and second flip-flops, and
wherein for each of the first through the fourth division units, the output signal of the first flip-flop, the second flip-flop, or the NOR gate is output as the corresponding generated oscillator signal of the corresponding division unit.

19. The ⅓ duty cycle oscillator apparatus of claim 18, wherein each of the first through the fourth division units uses the output signal of the first flip-flop of the corresponding division unit as the corresponding generated oscillator signal if the predetermined number is 1, uses the output signal of the second flip-flop of the corresponding division unit as the corresponding generated oscillator signal if the predetermined number is 2, and uses the output signal of the NOR gate of the corresponding division unit as the corresponding generated oscillator signal if the predetermined number is 3.

20. A ⅓ duty cycle oscillator signal generating method comprising:
generating a first through a fourth oscillator signals, each signal having a ½ duty cycle, a same predetermined frequency, and phases of 0°, 90°, 180°, and 270° respectively;
generating a fifth oscillator signal having a ⅓ duty cycle and ⅓ the predetermined frequency of the first oscillator signal, by dividing the first oscillator signal, by three;
generating a sixth oscillator signal having a ⅓ duty cycle and ⅓ the predetermined frequency of the second oscillator signal by dividing the second oscillator signal, by three;

generating a seventh oscillator signal having a ⅓ duty cycle and ⅓ the predetermined frequency of the third oscillator signal by dividing the third oscillator signal, by three; and generating an eighth oscillator signal having a ⅓ duty cycle and ⅓ the predetermined frequency of the fourth oscillator signal by dividing the fourth oscillator signal, by three, wherein the fifth through eighth oscillator signals respectively each have phases of 0°, 270°, 180°, and 90°.

21. The ⅓ duty cycle oscillator signal generating method of claim 20, further comprising generating a reset signal according to an edge of the first oscillator signal, the second oscillator signal, the third oscillator signal, or the fourth oscillator signal, wherein each of the generating of the fifth oscillator signal, the generating of the sixth oscillator signal, the generating of the seventh oscillator signal, and the generating of the eighth oscillator signal is started according to the reset signal.

22. The ⅓ duty cycle oscillator signal generating method of claim 21, wherein each of the generating of the fifth oscillator signal, the generating of the sixth oscillator signal, the generating of the seventh oscillator signal, and the generating of the eighth oscillator signal comprises:

starting to generate pulses of the corresponding generated oscillator signal if a predetermined number of edges of the corresponding divided oscillator signal are received, after the generating is started according to the reset signal, and wherein the predetermined number is one of 1 through 3.

23. A ⅓ duty cycle oscillator apparatus comprising:

an oscillator unit generating a first and a second oscillator signal, each having a ½ duty cycle, a same predetermined frequency, and opposite phases;

a first division unit generating a third oscillator signal having a ⅓ duty cycle and ⅓ the predetermined frequency of the first oscillator signal, by dividing the first oscillator signal by three; and a second division unit generating a fourth oscillator signal having a ⅓ duty cycle and ⅓ the predetermined frequency of the second oscillator signal, by dividing the second oscillator signal by three, wherein the third and fourth oscillator signals have opposite phases.

24. The ⅓ duty cycle oscillator apparatus of claim 23, further comprising a reset signal generating unit which generates a reset signal according to an edge of the first oscillator signal or an edge of the second oscillator signal, wherein operation of each of the first and the second division units is started according to the reset signal.

25. The ⅓ duty cycle oscillator apparatus of claim 24, wherein each of the first and the second division units starts to generate pulses of the corresponding generated oscillator signal if a predetermined number of edges of the corresponding divided oscillator signal are received by the corresponding division unit, after operation of the corresponding division unit is started according to the reset signal, and wherein the predetermined number is one of 1 through 3.

26. The ⅓ duty cycle oscillator apparatus of claim 25, wherein each of the first and the second division units comprises a first flip-flop, a second flip-flop, and a NOR gate, wherein for each of the first and the second division units, an output signal of the first flip-flop is used as an input signal of the second flip-flop, wherein for each of the first and the second division units, output signals of the first and the second flip-flops are used as input signals of the NOR gate, wherein for each of the first and the second division units, an output signal of the NOR gate is used as an input signal of the first flip-flop, wherein for each of the first and the second division units, the reset signal is used as reset signals of the first and the second flip-flops, wherein for each of the first and the second division units, the corresponding divided oscillator signal of each of the first and the second division units is used as clock signals of the first and second flip-flops, and wherein for each of the first and the second division units, the output signal of the first flip-flop, the second flip-flop, or the NOR gate is used as the corresponding generated oscillator signal of the corresponding division unit.

27. The ⅓ duty cycle oscillator apparatus of claim 26, wherein each of the first and the second division units uses the output signal of the corresponding first flip-flop as the corresponding generated oscillator signal if the predetermined number is 1, uses the output signal of the corresponding second flip-flop as the corresponding generated oscillator signal if the predetermined number is 2, and uses the output signal of the corresponding NOR gate as the corresponding generated oscillator signal if the predetermined number is 3.

28. A ⅓ duty cycle oscillator signal generating method comprising:

generating a first and a second oscillator signal, each signal having a ½ duty cycle, a same predetermined frequency, and opposite phases;

generating a third oscillator signal having a ⅓ duty cycle and ⅓ the predetermined frequency of the first oscillator signal, by dividing the first oscillator signal by three; and generating a fourth oscillator signal having a ⅓ duty cycle and ⅓ the predetermined frequency of the second oscillator signal, by dividing the second oscillator signal by three;

wherein the third and fourth oscillator signals have opposite phases.

29. The ⅓ duty cycle oscillator signal generating method of claim 28, further comprising generating a reset signal according to an edge of the first oscillator signal or an edge of the second oscillator signal, wherein each of the generating of the third oscillator signal and the generating of the fourth oscillator signal is started according to the reset signal.

30. The method of claim 29, wherein each of the generating of the third oscillator signal and the generating of the fourth oscillator signal comprises starting to generate pulses of the corresponding generated oscillator signal if a predetermined number of edges of the corresponding divided oscillator signal are received, after the generating is started according to the reset signal, and wherein the predetermined number is one of 1 through 3.

* * * * *